(12) United States Patent
Welker et al.

(10) Patent No.: US 7,872,494 B2
(45) Date of Patent: Jan. 18, 2011

(54) MEMORY CONTROLLER CALIBRATION

(75) Inventors: James A. Welker, Leander, TX (US);
Hector Sanchez, Cedar Park, TX (US);
Joshua Siegel, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 35 days.

(21) Appl. No.: 12/483,386

(22) Filed: Jun. 12, 2009

(65) Prior Publication Data

US 2010/0315119 A1    Dec. 16, 2010

(51) Int. Cl.
*H03K 17/16* (2006.01)
*H03K 19/003* (2006.01)

(52) U.S. Cl. .......................... 326/30; 365/191; 365/198
(58) Field of Classification Search ................. 326/30; 365/189.05, 191, 198, 233.13
See application file for complete search history.

(56) References Cited

U.S. PATENT DOCUMENTS

| | | | |
|---|---|---|---|
| 5,945,862 A | 8/1999 | Donnelly et al. | |
| 5,963,074 A | 10/1999 | Arkin | |
| 5,994,938 A | 11/1999 | Lesmeister | |
| 6,330,197 B1 | 12/2001 | Currin et al. | |
| 6,795,931 B1 | 9/2004 | LaBerge | |
| 7,019,556 B2 * | 3/2006 | Yoo | 326/30 |
| 7,109,807 B2 | 9/2006 | Lin | |
| 7,263,154 B2 | 8/2007 | Hsu et al. | |
| 7,444,535 B2 | 10/2008 | Hsieh et al. | |
| 7,453,297 B1 | 11/2008 | Kaviani | |
| 7,459,930 B2 | 12/2008 | Mei | |
| 7,467,255 B2 | 12/2008 | Huang | |
| 7,642,831 B2 | 1/2010 | Nguyen | |
| 2003/0048113 A1* | 3/2003 | Haycock et al. | 326/30 |
| 2005/0047192 A1* | 3/2005 | Matsui et al. | 365/145 |
| 2007/0058479 A1* | 3/2007 | Matsui | 365/233 |
| 2007/0097781 A1 | 5/2007 | Li et al. | |
| 2008/0120457 A1* | 5/2008 | Gillingham et al. | 711/105 |
| 2009/0206875 A1* | 8/2009 | Tran et al. | 326/38 |

OTHER PUBLICATIONS

C. Yoo et al., "Open-loop full-digital duty cycle correction circuit," Electronics Letters, May 26, 2005, vol. 41, No. 11.
U.S. Appl. No. 12/483,392, filed Jun. 12, 2009.
Notice of Allowance mailed Jun. 28, 2010 for U.S. Appl. No. 12/483,392, 10 pages.

* cited by examiner

*Primary Examiner*—Rexford N Barnie
*Assistant Examiner*—Jany Tran

(57) ABSTRACT

Components of a memory controller are calibrated in a select sequence to compensate for variances in skew and signal level variations. The offset bias of the receiver of the I/O cell and the termination resistance of the I/O cell are calibrated. The duty cycles of the transmit path and receive path associated with the I/O cell can be calibrated using the calibrated receiver. In one aspect, the driver of the I/O cell can be calibrated prior to calibrating the receiver. Performing the calibration processes of the memory controller in one of the particular sequences described herein improves the timing budgets for the signaling conducted by the memory controller.

20 Claims, 11 Drawing Sheets

MEMORY CONTROLLER CALIBRATION

CROSS-REFERENCE TO RELATED APPLICATIONS

The present application is related to U.S. patent application Ser. No. 12/483,392, filed on Jun. 12, 2009 and entitled "Multiple-Stage, Signal Edge Alignment Apparatus and Methods."

FIELD OF THE DISCLOSURE

The present disclosure relates to memory controllers and more particularly to calibration of memory controllers.

BACKGROUND

A memory controller typically acts as the interface between a memory and one or more data processing components that make use of the memory for storing data. The memory controller therefore is responsible for ensuring proper alignment and interpretation of the various signaling conducted between the memory controller and the memory. However, process, voltage, and temperature (PVT) variations and other factors in the memory system can introduce significant variances in the skew of the signaling throughout the memory system and in the relative signal levels at the input/output (I/O) of the memory controller. As the frequencies increase, this variation becomes more pronounced and makes it more difficult to effectively design an overall memory system. This problem is particularly pronounced in double data rate (DDR) memories due to the use of both the rising edges and falling edges of the reference clock for signaling purposes. Accordingly, a technique for calibrating the memory controller to compensate for the characteristics of the memory system would be advantageous.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-13 illustrate example techniques for calibrating a memory controller so as to compensate for variances in skew and signal level variations due to process, voltage, and temperature (PVT) variations and other factors. In at least one embodiment, the output impedance of a driver of an I/O cell of the memory controller that is connected to a memory is calibrated. Upon calibration of the output impedance of the driver, the offset bias or offset biases applied to one or more transistor of an input stage of the receiver of the I/O cell and the termination resistance of the I/O cell are calibrated using the calibrated driver. As the original calibration of the driver relied on an uncalibrated receiver, the output impedance of the driver can be calibrated again using the calibrated receiver. The duty cycle of the transmit path and receive path associated with the I/O cell can then be corrected/calibrated using the calibrated receiver and calibrated driver. This process can be repeated for each I/O cell of the memory controller. Alternately, the adjustments determined from one I/O cell also can be applied to another I/O cell without separately calibrating the other I/O cell. By performing the calibration process of the memory controller in one of the particular orders described herein, the timing budgets for the signaling conducted by the memory controller can be significantly improved. Although example techniques for the various calibration processes are described herein, the calibration processes are not limited to these specific techniques, but instead may be implemented using any of a variety of calibration processes without departing from the scope of the present disclosure.

Figure 1:
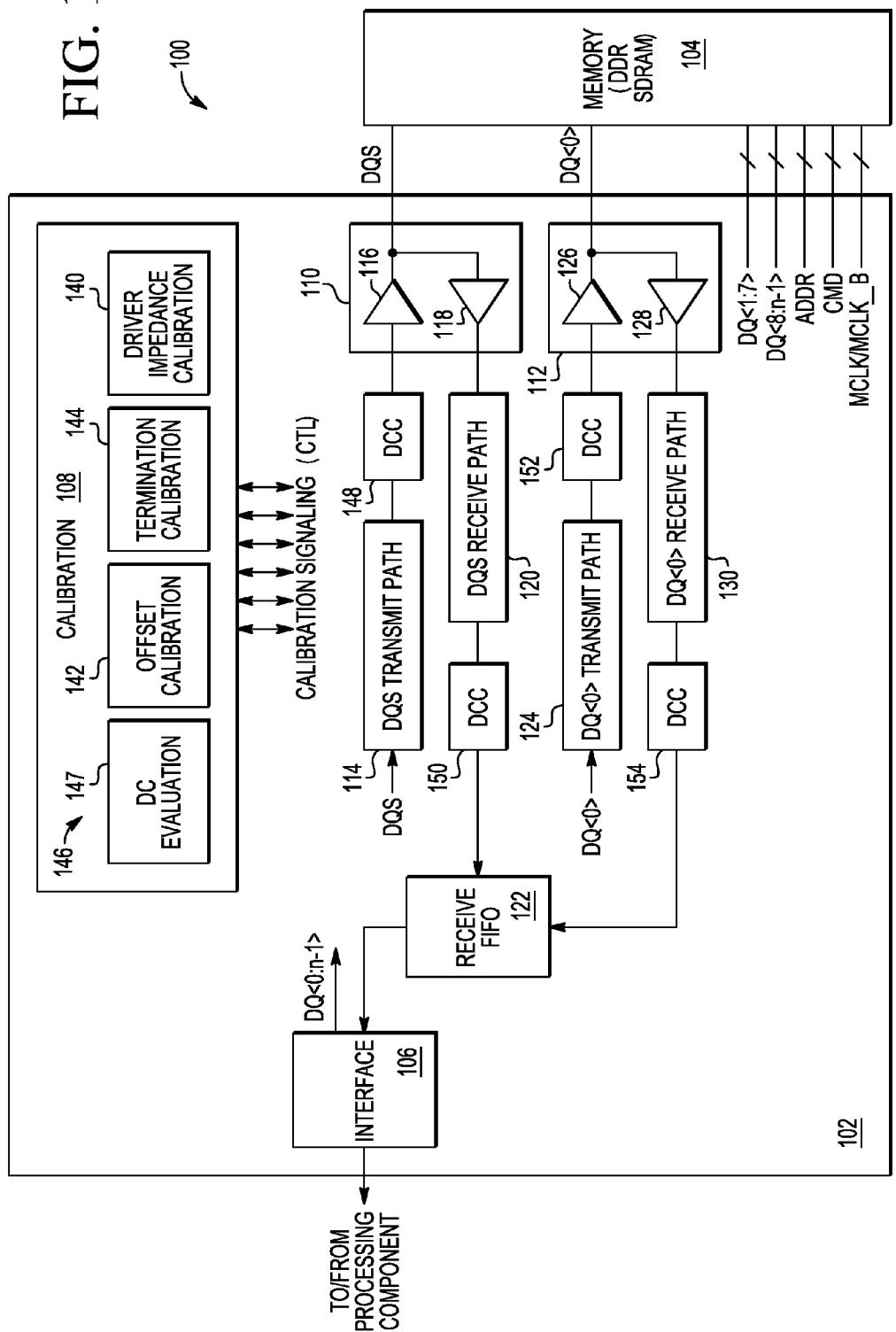
FIG. 1 is a diagram illustrating a memory system having a memory controller with calibration in accordance with at least one embodiment of the present disclosure.

FIG. 1 illustrates a memory system 100 in accordance with at least one embodiment of the present disclosure. The memory system 100 includes a memory controller 102 and a memory 104. The memory 104 can include any of a variety of memory architectures, including a dynamic random access memory (DRAM) architecture, a static random access memory (SRAM) architecture, a flash memory architecture, and the like. For ease of illustration, the techniques of the present application are described in an example context of a dual data rate (DDR) memory due to the particular timing constraints introduced by the use of both edges of the timing clock in DDR memories. However, these techniques are not limited to this context but instead may be implemented to calibrate memory controllers for any of a variety of memory architectures using the guidelines provided herein.

The memory controller 102 conducts signaling with the memory 104 on behalf of one or more processing components (e.g., data processors, peripheral devices, etc.). This signaling includes a data strobe signal DQS, data signaling for one or more data words transmitted to, or received from, the memory 104 (identified as data signals DQ<0:n−1>), clock signaling MCLK/MCLK_B, address signaling ADDR, and command signaling CMD. The memory controller 102 includes a processing device interface 106, a calibration controller 108, and a plurality of input/output (I/O) cells, each I/O cell to conduct a corresponding signal between the memory controller 102 and the memory 104. For ease of illustration, only two I/O cells are illustrated: I/O cell 110 for conducting the data strobe signal DQS; and I/O cell 112 for conducting the data signal DQ<0>. The I/O cells for the other signals conducted between the memory 104 and the memory controller 102 are similarly configured.

Each signal conducted between the memory controller 102 and the memory 104 includes either a transmit path and a driver to conduct a corresponding signal from circuitry internal to the memory controller 102 to the memory 104 or a receiver and a receive path to conduct a corresponding signal received from the memory 104 to one or more circuits internal to the memory controller 102. To illustrate, for the data strobe signal DQS (which may be generated internally at the memory controller 102 or received from an external source), the memory controller 102 includes a DQS transmit path 114 and a driver 116 of the I/O cell 110 to conduct the DQS signal to the memory 104, and further includes a receiver 118 of the I/O cell 110 and a DQS receive path 120 to conduct a DQS signal received from the memory 104 to one or more circuits of the memory controller 102 (e.g., to a receive first-in, first-out (FIFO) buffer 122). As also illustrated, for the data signal DQ<0>, the memory controller 102 includes a DQ<0> transmit path 124 and a driver 126 to conduct an outgoing data signal DQ<0> from the memory controller 102 to the memory 104, as well as a receiver 128 and a DQ<0> receive path 130 to conduct an incoming data signal DQ<0> from the memory 104 to one or more circuits of the memory controller 102 (e.g., to the receive FIFO buffer 122). The other data signals DQ<1:n−1>, the address signals ADDR, and the command signals CMD likewise implement similar transmit paths, drivers, receive paths, and receivers to conduct signaling between the memory controller 102 and the memory 104. The transmit paths and receive paths of the memory controller 102 can include any of a variety of circuits and other components to facilitate processing of the communicated signals. To illustrate, in one embodiment, the transmit paths and receive paths include delay chains to introduce delays into the transmitted/received signals for synchronization purposes. The transmit paths and receive paths likewise can include interface circuitry for debugging purposes, such as an IEEE 1149.1 (JTAG) interface.

The calibration controller 108 manages the calibration of the memory controller 102 in accordance with the calibration sequences described herein. To this end, the calibration controller 108 includes a driver impedance calibration module 140, an offset calibration module 142, a termination calibration module 144, and a duty cycle correction (DCC) calibration module 146 comprising one or more duty cycle evaluation modules 147 and one or more DCC modules, such as DCC modules 148, 150, 152, and 154. The calibration modules of the calibration controller 108 can be implemented via one or more state machines or other circuitry, via software executed by one or more processing devices, or a combination thereof. For ease of description, the various calibration modules are illustrated as centralized at a particular location. However, as described in greater detail below, the circuitry of the calibration modules typically is distributed among the other circuitry of the memory controller 102 as appropriate.

Calibration of driver impedance of the I/O cells of the memory controller 102 is used to ensure each driver meets the specified input voltage threshold levels (VIL and VIH) of the interface to the memory 104. Further, the separate calibration of pull-up and pull-down transistors of the driver allows the driver slew rates to be matched so as to maintain a symmetric data eye pattern. Thus, the driver calibration process ensures proper signaling levels and optimal transient waveform characteristics optimized to the impedance of the transmission line connecting the driver to the memory 104. Accordingly, the driver impedance calibration module 140 is configured to calibrate the output impedances of the drivers of the I/O cells using any of a variety of conventional driver impedance calibration techniques, such as the techniques described in U.S. Pat. No. 7,467,255 or U.S. Pat. No. 7,459,930, the entireties of which are incorporated by reference herein.

The receivers of the I/O cells of the memory controller 102 typically are implemented as differential receivers. As such, the input stages of the receivers may be subjected to a differential input offset voltage, which can degrade the sensitivity of the receiver and therefore result in an asymmetric data eye. Accordingly, the offset calibration module 142 is configured to calibrate the offset bias applied to the bodies of the pair of transistors at the input stage of the receivers so as to remove any input offset voltage that may otherwise be present at the input stage of the receivers. An example of the offset bias calibration employed by the offset calibration module 142 is described herein with reference to FIGS. 3 and 4.

The input voltage threshold levels (VIL and VIH) of an I/O cell during a receive transaction are affected by the relationship between the impedances between the driver driving the signaling and the termination resistance of the I/O cell receiving the signaling. Thus, it can be important to obtain a symmetric termination resistance with respect to the reference voltages $V_{DD}$ and $V_{SS}$ (or GND) at the I/O cell so that the AC signal data eye is centered around the reference voltage VREF used by the I/O cell. Accordingly, the termination calibration module 144 is configured to calibrate the termination resistance at the output of each I/O cell to provide more optimal pull-up and pull-down termination resistances at the input of the I/O cell. An example of the termination resistance calibration employed by the termination calibration module 144 is described herein with reference to FIGS. 5 and 6.

Ideally, the signals conducted in the memory controller 102 and between the memory controller 102 and the memory 104 has equal low and high level delays so as to provide symmetric data eyes. However, PVT variations in the circuits that transmit these signals can introduce offsets into these delays, which often results in degraded, or asymmetric, data eyes. Accordingly, The DCC calibration module 146 is configured to correct the duty cycle of certain signaling in the memory controller 102 to improve the timing margins for the signaling. Duty cycle correction is particularly beneficial for the data strobe signal DQS for a DDR-type memory as data is transmitted/received using both the rising edges and falling edges of the data strobe signal DQS. In one embodiment, the DCC calibration module 146 includes the DC evaluation module 147 and a plurality of DCC modules positioned in the signaling paths of the memory controller 102. To illustrate, the DCC calibration module 146 can include the DCC module 148 positioned between the output of the DQS transmit path and the input of the driver 116 of the I/O cell 110, the DCC module 150 positioned between the output of the DQS receive path 120 and the receive FIFO 122, a DCC module 152 positioned between the output of the DQ<0> transmit path 124 and the input of the driver 126 of the I/O cell 112, and a DCC module 154 positioned between the output of the DQ<0> receive path 130 and the receive FIFO 122. The duty cycle (DC) evaluation module 147 is configured to evaluate the duty cycle of a particular signal and signal the corresponding DCC module through which the signal passes to correct any imbalance detected in the duty cycle of the signal. In effect, the DC evaluation module 147 and the corresponding DCC module together act as a negative feedback loop to correct the duty cycle of the signal being evaluated. In one embodiment, a single DC evaluation module 147 is used to evaluate each signal capable of duty cycle correction by selectively providing the signal to the DC evaluation module 147 via a multiplexer. This approach can reduce the silicon area and complexity needed to implement the DCC calibration module 146. In another embodiment, multiple DC evaluation modules 147 are implemented so as to remove the uncertainty introduced by the multiplexer in the measurement path. In this instance, there can be a one-to-one correspondence between DC evaluation modules and DCC modules. Alternately, multiple DCC modules can share the same DC evaluation module (e.g., the DCC modules for the transmit path and the receive path of a given signal may be evaluated by the same DC evaluation module). An example of the DCC calibration employed by the DCC calibration module 146 is described herein with reference to FIGS. 7-13.

Figure 2:
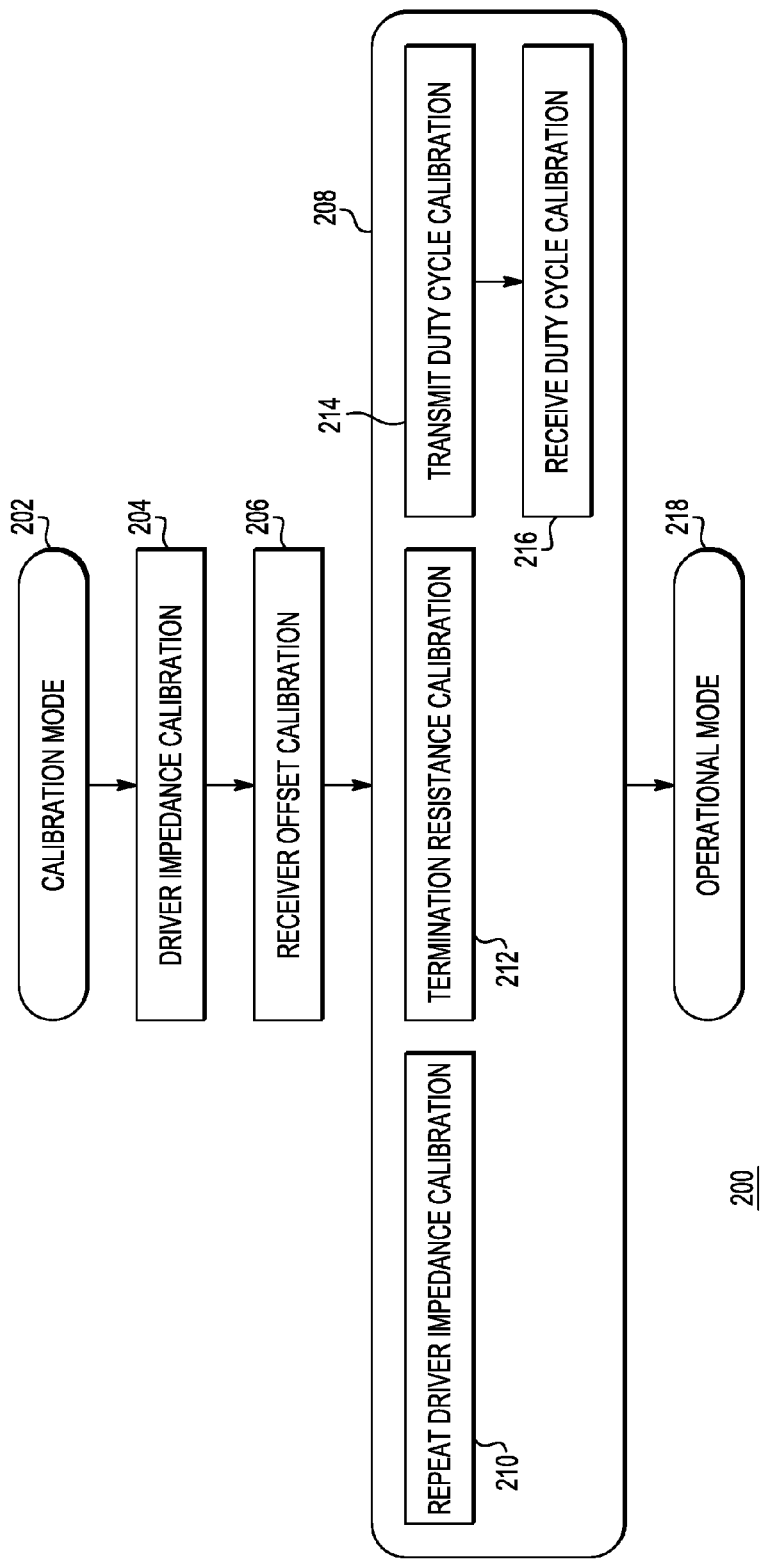
FIG. 2 is a flow diagram illustrating a method for calibrating the memory controller of the memory system of FIG. 1 in accordance with at least one embodiment of the present disclosure.

FIG. 2 illustrates an example calibration method 200 for the memory controller 102 of the memory system 100 of FIG. 1 in accordance with at least one embodiment of the present disclosure. As noted above, the frequencies at which memory systems currently operate can materially impact the timing budgets and signaling requirements of the signaling conducted between a memory controller and a corresponding memory, as well as within the memory controller itself. The calibration processes performed by the calibration controller 108 (FIG. 1) can facilitate suitable operation of the memory controller 102 in view of these signaling constraints. Moreover, application of these calibration processes to the memory controller 102 in one of the particular sequences described with reference to the calibration method 200 serves to more fully ensure that the components of the memory controller 102 are optimally calibrated, and thus improving the likelihood that the memory controller 102 operates within the relevant design constraints of the memory system.

As described with reference to FIG. 1, the memory controller 102 has a number of lines carrying signaling between the memory controller 102 and the memory 104, such as data signaling, address signaling, and command signaling, as well as a number of transmission paths for this signaling within the memory controller 102 itself. The calibration processes of method 200 can be applied in a variety of ways with respect to the signaling interfaces and internal transmission path. In one embodiment, the entire sequence of calibration processes is completed for one signal (e.g., a data bit signal) before performing the entire sequence of calibration processes for the next signal. To illustrate, the calibration method 200 may be applied in its entirety to for the components of the memory controller 102 associated with the data strobe signal DQS (i.e., the I/O cell 110, the DQS transmit path 114, the DCC module 148, the DQS receive path 120, and the DCC module 150) before moving on to the components of the memory controller 102 associated with the data signal DQ<0> (i.e., the I/O cell 112, the DQ<0> transmit path 124, the DCC module 152, the DQ<0> receive path 130, and the DCC module 154). In another embodiment, a particular calibration process is performed for each signal in turn before moving to the next calibration process. To illustrate, a driver impedance calibration process may be performed for the driver of each I/O cell before moving on to the application of an offset calibration process to the receiver of each I/O cell. Alternately, the calibration method 200 can be applied in association with each bit signal of a byte (e.g., DQ<0:7>) before calibrating the bit signals of the next byte (e.g., DQ<8:15>). Further, the calibration parameters determined for one signal can be applied to another signal without specific calibration of the particular signal. To illustrate, the timing and signaling constraints for the address signaling (ADDR), the command signaling (CMD), and the clock signaling MCLK/MCLK_B typically are much lower than the timing and signaling constraints for the data and strobe signaling. Accordingly, the driver impedance, offset bias, termination resistance, and DCC parameters determined for the data signal having a transmission path most proximate to the transmission path of the signaling for the address signaling and the command signaling can be used to calibrate the components of the memory controller 102 associated with the ADDR signaling and the CMD signaling without independently determining the appropriate calibration parameters for the address signaling and command signaling.

At block 202, the memory controller 202 enters a calibration mode, in response to which the calibration controller 108 initializes the calibration modules in preparation for calibration of the memory controller 202. The calibration mode can be triggered in any of a variety of ways. In one embodiment, the calibration mode is triggered only one time during the life of the memory system 100 (e.g., during manufacturing or testing). In one embodiment, the calibration mode is triggered upon every reset or power-on-reset of the memory system 100. In yet another embodiment, to accommodate for voltage and temperature drift the calibration mode is triggered periodically or quasi-periodically, such as after a certain number of memory operations, after a certain time period, or after a variation in one or more of the components is determined by, for example, a pulse-width measure circuit to exceed a corresponding threshold.

Many, if not most, of the calibration processes employed in a conventional memory controller typically rely in some way on the drivers of the I/O cells. Similarly, the calibration processes of the memory controller 102 described herein each relies on the drivers of the I/O cells. Accordingly, at block 204 the calibration controller 108 first employs the driver impedance calibration module 140 to perform any of a variety of conventional driver impedance calibration processes to initially calibrate the output impedance of the driver of an I/O cell associated with a signal selected for calibration.

The calibration processes of the memory controller 102 also rely on the receiver of the corresponding I/O cell. To illustrate, the calibration of the termination resistance of the I/O cell relies on the receiver of the I/O cell. As another example, calibration of the duty cycle correction for the transmit path and receive path relies on the receiver of the I/O cell (or an alternate receiver separately implemented for calibration of the duty cycle correction) and thus compensation for the input offset of the receiver should be calibrated before duty cycle correction calibration to avoid degradation of the duty cycle due to uncompensated input offset at the receiver.

Accordingly, following the initial calibration of the output impedance of the driver of the I/O cell associated with the selected signal, at block 206 the calibration controller 108 employs the offset calibration module 142 to perform the receiver offset calibration process described below with reference to FIGS. 3 and 4 for the receiver of the I/O cell of the selected signal.

With the driver and the receiver of the selected I/O cell calibrated, the calibration controller 108 then can perform the other calibration processes that rely on the driver and the receiver of the selected I/O cell. As graphically depicted in FIG. 2 by the parallel arrangement of the blocks corresponding to these calibration processes within a larger block 208, these calibration processes can be performed in one of a variety of sequences subsequent to the sequence of the output impedance calibration of block 204 followed by the receiver offset calibration process of block 206.

As an initial matter, many conventional output impedance calibration processes rely on feeding the signal output by the driver of an I/O cell back through the receiver of the I/O cell. However, as noted above, the receiver of the I/O cell of the selected signal of the memory controller 102 was not calibrated until after the driver of the I/O cell was calibrated. Thus, because the initial calibration of the driver relied on an uncalibrated receiver, at block 210 the output impedance calibration of the driver of the I/O cell can be repeated using the now-calibrated receiver to more accurately calibrate the driver.

At block 212, the calibration controller 108 can employ the termination calibration module 144 to perform the termination resistance calibration process described below with reference to FIGS. 5 and 6 for the I/O cell of the selected signal. At block 214, the calibration controller 108 can employ the DCC module 146 to perform the DCC process for the transmit path associated with the selected signal. At block 216 the calibration controller can employ the DCC module 146 to perform the DCC process for the receive path associated with the selected signal. As illustrated by FIG. 1, the signaling used to calibrate the duty cycle in a receive path of the memory controller 102 passes through a transmission path first. Accordingly, to avoid transmit-path duty cycle distortion, the DCC module 146 calibrates the duty cycle correction of the transmit path before calibrating the duty cycle correction of the corresponding receive path so as to avoid any such transmit-path duty cycle distortion that would otherwise negatively impact the receive-path duty cycle correction. For unidirectional signaling between the memory controller 102 and the memory 104, it is only necessary to calibrate the duty cycle correction for the one path of the memory controller associated with the uni-directional signaling (e.g., the receive path for a signal only received by the memory controller 102 or the transmit path for a signal only transmitted by the memory controller 102).

In one sequence, the second calibration (or recalibration) of the output impedance of the driver (block 210) is performed before the calibration of the termination resistance of the I/O cell (block 212), which is then followed by the duty cycle correction of the transmit path (block 214) and then the receive path (block 216). In another sequence, the duty cycle correction of the transmit path (block 214) and the receive path (block 216) is performed before the calibration of the termination resistance (block 212). Further, for uni-directional signaling only the transmit-path duty cycle calibration (block 214) or receive-path duty cycle calibration (block 216) is needed.

Performance of the calibration processes in one of the particular sequences identified more fully ensures that the memory controller 102 operates within specified timing and signaling constraints due to the identified relationships between the components of the memory 102. To illustrate, the inventors have found that applying one of the particular calibration sequences described herein can optimize an I/O that typically creates 160 picoseconds (ps) of duty cycle degradation over PVT so as to be within the accuracy of the measurement circuit (e.g., 20-30 ps).

After performing one of the particular calibration sequences described above, the calibration parameters determined from the calibration sequence are set and the memory system 100 enters an operational mode at block 218 with the memory controller 102 calibrated according to the determined calibration parameters. As noted above, these calibration parameters can be permanently fixed (e.g., by storing them to one-time-programmable (OTP) memory or flash memory), or the calibration mode may be periodically reentered after a reset, after a certain number of memory operations or a certain duration, or when a measured operational parameter of the memory controller 102 exceeds a corresponding threshold.

Figure 4:
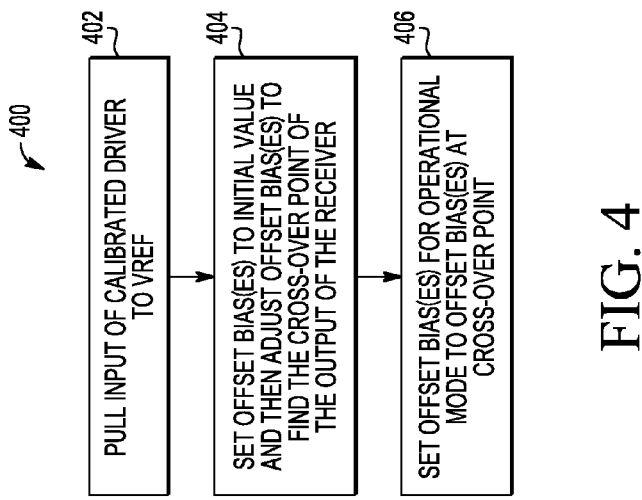
FIG. 4 is a flow diagram illustrating a method for calibrating the offset compensation biasing of the receiver of FIG. 3 in accordance with at least one embodiment of the present disclosure.
Figure 3:
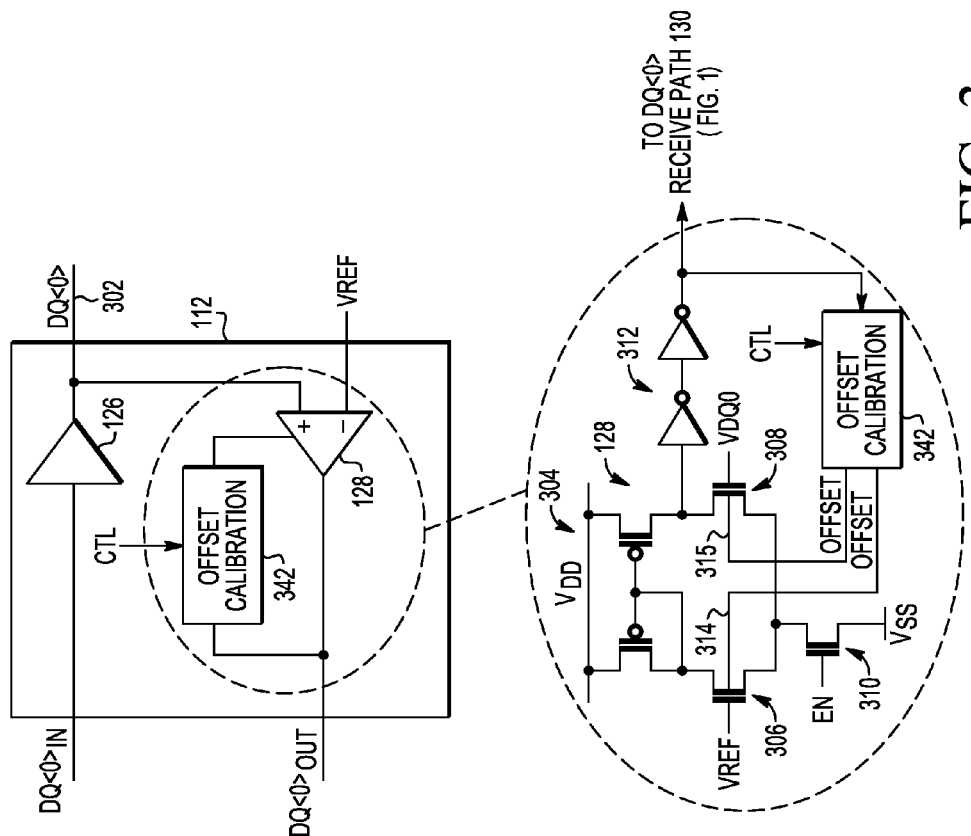
FIG. 3 is a diagram illustrating a receiver containing amplifier offset compensation and calibration for use in the memory controller of the memory system of FIG. 1 in accordance with at least one embodiment of the present disclosure.

FIGS. 3 and 4 illustrate an example implementation and operation of an offset calibration module for calibrating the offset bias of a receiver of an I/O cell in accordance with at least one embodiment of the present disclosure. For ease of illustration, the offset calibration module and the corresponding calibration process are described with respect to the I/O cell 112 associated with the data signal DQ<0> due to its single-ended nature. This configuration and process also is implemented for some or all of the other signaling between the memory controller 102 and the memory 104 using the same principles described below. Alternately, the offset bias calibration parameter determined for one signal can be applied to other signals as well. To illustrate, the offset bias calibration parameter for the receiver 128 associated with the data signal DQ<0> can be applied to calibrate the offset bias for the receiver 118 associated with the data strobe signal DQS without having to separately calibrate the receiver 118.

In the depicted example, the I/O cell 112 includes the driver 126, the receiver 128, and an offset calibration module 342 (corresponding to the offset calibration module 142, FIG. 1). The driver 126 includes an input to receive a data signal DQ<0>$_{IN}$ from the DQ<0> transmit path 124 (FIG. 1) and an output to drive this signal on the DQ<0> signal line 302 for receipt by the memory 104. The receiver 128 includes a positive input connected to the DQ<0> signal line 302 (and thus connected to the output of the driver 126), a negative input configured to receive a reference signal VREF (typically a voltage halfway between $V_{DD}$ and $V_{SS}$ (or $V_{DD}/2$ when $V_{SS}$ is ground), and an output to provide a data signal DQ<0>$_{OUT}$ to the DQ<0> receive path 130 (FIG. 1), where the level of the data signal DQ<0>$_{OUT}$ at any given point is based on the relationship between the level on the DQ<0> signal line 302 and the reference voltage VREF. The offset calibration module 342 includes an input connected to the output of the receiver 128 and an output connected to the body terminals of the transistors of the input stage of the receiver 128, whereby the offset calibration module 342 is configured to provide an offset bias to the body terminals of these transistors that is determined based on the calibration process described below. In one embodiment the same offset bias is applied to both transistors. Alternately, a separate offset bias can be determined and applied for each transistor of the input stage of the receiver 128.

FIG. 3 further illustrates an example circuit-level implementation of the receiver 128 relative to the offset calibration module 342. As shown, the receiver 128 includes a current mirror 304, transistors 306, 308, and 310, and a delay chain 312. The transistor 306 includes a first current terminal connected to a first terminal of the current mirror 304, a second current terminal, an input terminal to receive the reference voltage VREF, and a body terminal connected the offset calibration module 342 to receive an offset bias voltage 314. The transistor 308 includes a first current terminal connected to a second terminal of the current mirror 304, a second current terminal, an input terminal to receive the voltage present on the DQ<0> signal line 302 (VDQ0), and a body terminal connected to the offset calibration module 342 to receive the offset bias voltage 315 (which may be the same as, or different from, the offset bias voltage 314). The transistor 310 includes a first current terminal connected to the second current terminals of the transistors 306 and 308, a second current terminal connected to the voltage $V_{SS}$, and an input terminal to receive an enable signal EN. The delay chain 312 includes one or more inverters or other delay elements connected between the second terminal of the current mirror 304 and the input to the DQ<0> receive path 130 (and the input of the input of the offset calibration module 342) for synchronization purposes.

FIG. 4 illustrates the method 400 of operation of the offset calibration module 342 in accordance with one embodiment. Following calibration of the output impedance of the driver 126 using any of a variety of output impedance calibration techniques known in the art, at block 402 the calibration controller 108 uses the control signaling CTL to signal the initiation of the offset calibration process for the receiver 128 of the I/O cell 112. In response to this signaling, the offset calibration module 342 pulls the input of the driver 126 to the reference voltage VREF (i.e., DQ<0>$_{IN}$=VREF) via a switch, pull-up transistor, or other mechanism (not shown). In this configuration, the calibrated driver 126 drives a reference voltage VREF (or an approximation thereof) onto the DQ<0> signal line 302, and thus drives the reference voltage VREF to the positive input of the receiver 128.

With both the positive input and the negative input of the receiver 128 at or near the reference voltage VREF, at block 404 the offset calibration module 342 sets the offset bias voltages 314 and 315 to an initial value (e.g., 0 volts), and then adjusts the offset bias voltages 314 and 315 until the a transition in the level of the output of the receiver 128 (the "cross-over point") 128 is detected (i.e., until the output level of the receiver 128 transitions from a "0" to a "1" or vice versa). As the offset biases at cross-over point in this setting indicates the optimal offset biases for the transistors 306 and 308 of the receiver 128, once the cross-over point is found, at block 406 the offset calibration module 342 sets the level of the offset bias voltages 314 and 315 at the cross-over point as the offset bias voltages to be applied to the body terminals of the corresponding transistors of the receiver 128 (e.g., transistors 306 and 308, respectively) during the operational mode of the memory controller 108.

Figure 6:
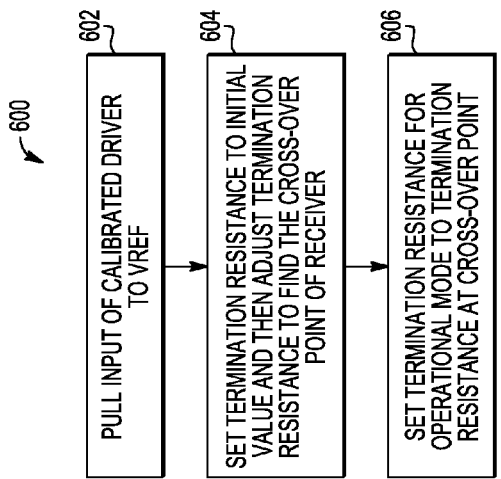
FIG. 6 is a flow diagram illustrating a method for calibrating a termination resistance of the I/O cell of FIG. 5 of the memory controller of the memory system of FIG. 1 in accordance with at least one embodiment of the present disclosure.
Figure 5:
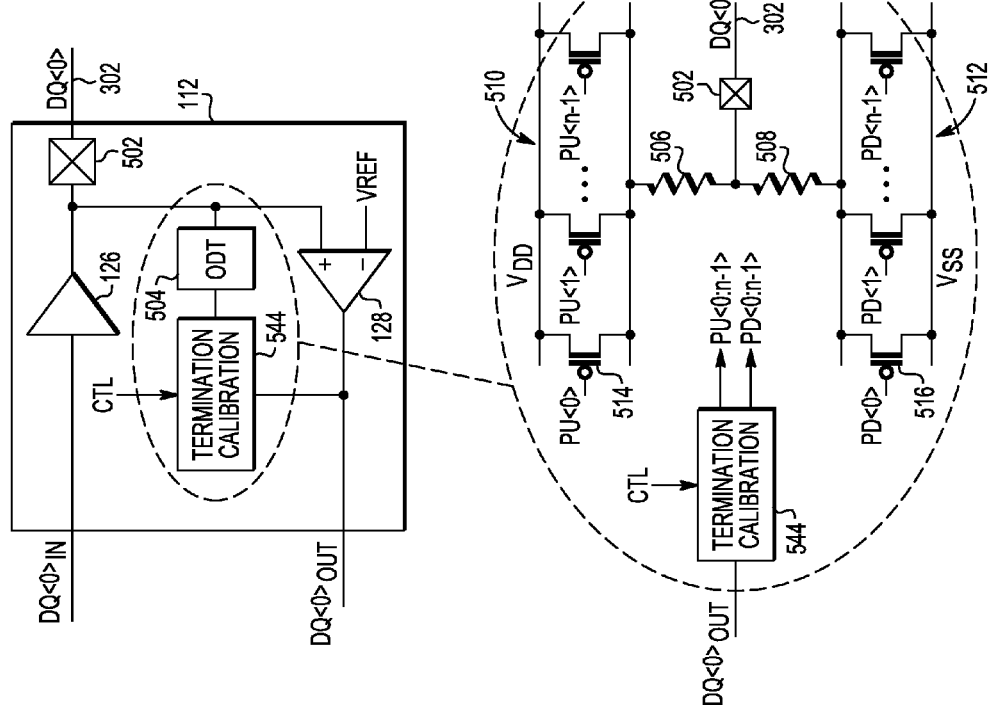
FIG. 5 is a diagram illustrating an example implementation of an input/output (I/O) cell containing termination calibration for use in the memory controller of the memory system of FIG. 1 in accordance with at least one embodiment of the present disclosure.

FIGS. 5 and 6 illustrate an example implementation and operation of a termination resistance calibration module for calibrating the termination resistance of an I/O cell in accordance with at least one embodiment of the present disclosure. For ease of illustration, the termination resistance calibration module and the corresponding calibration process are described with respect to the I/O cell 112 associated with the data signal DQ<0>. This configuration and process also is implemented for some or all of the other signaling between the memory controller 102 and the memory 104 using the same principles described below. Alternately, the termination resistance calibration parameters determined for one signal can be applied to other signals as well. To illustrate, the pull-up and pull-down termination resistance calibration parameters for the I/O cell 112 associated with the data signal DQ<0> can be applied to calibrate the pull-up and pull-down termination resistance calibration parameters for the I/O cell 110 associated with the data strobe signal DQS without having to separately calibrate the I/O cell 110.

In the depicted example, the I/O cell 112 includes the driver 126, the receiver 128, an I/O pad 502 connected to the DQ<0> signal line 302, an on-die termination circuit (ODT circuit) 504, and a termination resistance calibration module 544 (corresponding to the termination resistance calibration module 144, FIG. 1). The driver 126 includes an input to receive a data signal DQ<0>$_{IN}$ from the DQ<0> transmit path 124 (FIG. 1) and an output to drive this signal on the DQ<0> signal line 302 via the I/O pad 502 for receipt by the memory 104. The receiver 128 includes a positive input connected to the DQ<0> signal line 302 (and thus connected to the output of the driver 126), a negative input configured to receive the reference signal VREF, and an output to provide a data signal DQ<0>$_{OUT}$ to the DQ<0> receive path 130 (FIG. 1), where the level of the data signal DQ<0>$_{OUT}$ at any given point is based on the relationship between the level on the DQ<0> signal line 302 and the reference voltage VREF. The ODT circuit 504 provides a configurable or adjustable termination resistance at the I/O pad 502. The termination resistance calibration module 544 includes an input connected to the output of the receiver 128 and an output connected to the ODT circuit 504, whereby the termination resistance calibration module 544 is configured to adjust the termination resistance provided by the ODT circuit 504 based on the calibration process described below.

FIG. 5 further illustrates an example circuit-level implementation of the ODT circuit 504 relative to the termination resistance calibration module 342. As shown, the ODT circuit 504 includes two precision resistors 506 and 508, an adjustable pull-up resistance circuit 510, and an adjustable pull-down resistance circuit 512. The resistor 506 includes a first terminal connected to the I/O pad 502 and a second terminal. The resistor 508 includes a first terminal connected to the I/O pad 502 and a second terminal. The pull-up resistance circuit 510 includes a plurality of transistors 514 coupled in parallel between the voltage $V_{DD}$ and the second terminal of the resistor 506, wherein each transistor 514 receives at its input terminal a corresponding enable signal PU<X> from the control signaling PU<0:n−1> provided by the termination resistance calibration module 544. The pull-down resistance circuit 512 includes a plurality of transistors 516 coupled in parallel between the voltage $V_{SS}$ and the second terminal of the resistor 508, wherein each transistor 516 receives at its input terminal a corresponding enable signal PD<X> from the control signaling PD<0:n−1> provided by the termination resistance calibration module 544. In this configuration, the particular number of transistors 514 that are enabled affects the pull-up termination resistance between the I/O pad 502 and the voltage $V_{DD}$, and the particular number of transistors 516 that are enabled affects the pull-down termination resistance between the I/O pad 502 and the voltage $V_{SS}$. Accordingly, the termination resistance calibration module 544 can adjust the pull-up termination resistance and the pull-down termination resistance at the I/O pad 502 by adjusting the number of enabled transistors 514 and the number of enabled transistors 516, respectively.

FIG. 6 illustrates a method 600 of operation of the termination resistance module 544 in accordance with one embodiment. Following calibration of the output impedance of the driver 126 and the calibration of the offset bias of the receiver 128 using the technique described above, at block 602 the calibration controller 108 uses the control signaling CTL to signal the initiation of the termination resistance calibration process for the I/O cell 112. In response to this signaling, the termination resistance calibration module 344 pulls the input of the driver 126 to the reference voltage VREF (i.e., DQ<0>$_{IN}$=VREF) via a switch, pull-up transistor, or other mechanism (not shown). In this configuration, the calibrated driver 126 drives a reference voltage VREF (or an approximation thereof) onto the DQ<0> signal line 302, and thus drives the reference voltage VREF to the positive input of the receiver 128.

With both the positive input and the negative input of the receiver 128 at or near the reference voltage VREF, at block 604 the termination resistance module 544 sets the pull-up and pull-down termination resistances to initial values (e.g., by enabling all of the transistors 514 and 516), and then adjusts the pull-up termination resistance and the pull-down termination resistance by selectively enabling/disabling different numbers of the transistors 514 and the transistors 516 until the cross-over point of the output of the receiver 128 is found (i.e., until the output of the receiver 128 switches from a "0" to a "1" or vice versa). As the termination resistance at the cross-over point in this setting indicates the optimal termination resistance provided by the ODT circuit 504, once the cross-over point is found, at block 606 the termination resistance calibration module 544 sets pull-up termination resistance and pull-down termination resistance at the cross-over point as the termination resistance to be applied by the ODT circuit 504 during the operational mode of the memory controller 102.

Figure 7:
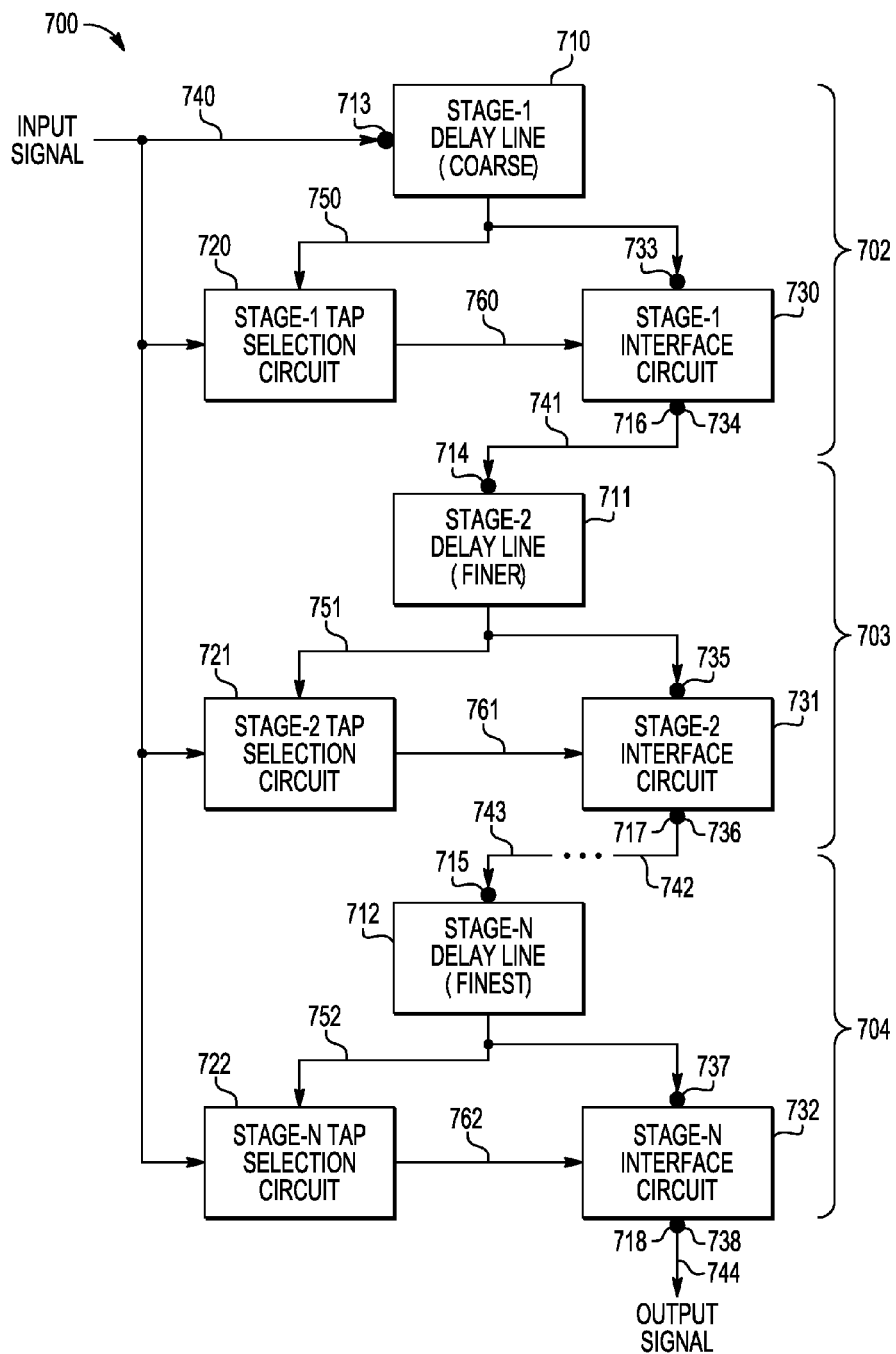
FIG. 7 is a diagram illustrating a multiple-stage edge alignment circuit utilized in a duty cycle correction module of the memory controller of the memory system of FIG. 1 in accordance with at least one embodiment of the present disclosure.

FIGS. 7-13 illustrate an example implementation and operation of the duty cycle correction calibration module 146 for calibrating the duty cycle correction employed in the memory controller 102 of the memory system 100 of FIG. 1 in accordance with at least one embodiment of the present disclosure. FIG. 7 illustrates a multiple-stage edge alignment circuit 700 utilized in the duty cycle correction calibration module 146 for edge alignment of a signal being processed. Edge alignment circuit 700 includes a number, N, of delay stages 702, 703, 704, where N may be any integer between 2 and 5. In other embodiments, N may be greater than 5. Although only three stages 702-704 are illustrated in FIG. 7, it is to be understood that edge alignment circuits may have as few as two stages or more than three stages, in various embodiments. The illustrated stages 702-104 are referred to herein as "stage-1" 702, "stage-2" 703, and "stage-N" 704.

Each stage 702-704 includes a delay stage input 713, 714, 715, a delay stage output 716, 717, 718, a delay line 710, 711, 712, a tap selection circuit 720, 721, 722, and an interface circuit 730, 731, 732. In one embodiment, an input signal 740 (e.g., a clock signal, the data strobe signal DQS, a data signal DQ<x> or other type of signal processed by the memory controller 102) is received at a delay stage input 713 of stage-1 702. More particularly, the input signal 740 is received by stage-1 delay line 710. Stage-1 delay line 710 includes a plurality of series-connected delay elements (not illustrated in FIG. 7), each of which applies a fixed-width delay, d1, having a first resolution or width. The sequential application of the fixed-width delays results in a plurality of delay line output signals 750 accessible at an output node (or "tap") following each delay element.

The delay line output signals 750 are received at inputs to stage-1 tap selection circuit 720 and stage-1 interface circuit 730, as shown in FIG. 7. Stage-1 tap selection circuit 720 also receives input signal 740, and stage-1 tap selection circuit 720 is adapted to determine which of the delay line output signals 750 most closely corresponds to a signal having a desired alignment with input signal 740. For example, stage-1 tap selection circuit 720 may be adapted to determine which of the delay line output signals 750 has rising edges (i.e., low-to-high transitions) that most closely align with falling edges (i.e., high-to-low transitions) of the input signal 740. Alternatively, as another example, stage-1 tap selection circuit 720 may be adapted to determine which of the delay line output signals 750 has falling edges that most closely align with rising edges of the input signal 740. Stage-1 tap selection circuit 720 may identify a particular delay line output signal 750 based on some other criteria of alignment with input signal 740, in other embodiments. As used herein, the term "target edges for alignment" refers to the type of edge of the input signal 740 and the type of edge of the delay line output signals 750 that are being aligned. For example, in the former embodiment described above, the target edges for alignment include the falling edges of the input signal 740 and the rising edges of the delay line output signals 750. In contrast, in the latter embodiment described above, the target edges for alignment include the rising edges of the input signal 740 and the falling edges of the delay line output signals 750

The identification of a delay line output signal 750 having a desired alignment with input signal 740 may be made, for example, by comparing and/or correlating input signal 740 (or an inverted or otherwise processed version thereof) with each of the delay line output signals 750. The "initially-identified" delay line output signal 750 includes the output signal 750 that is closest to having the desired alignment. An identifier of the tap associated with the initially-identified delay line output signal 750 may be considered to be an "initially-identified" tap. The initially-identified tap may be represented by a number, for example, that indicates which tap corresponds with the initially-identified delay line output signal 750.

In one embodiment, stage-1 tap selection circuit 720 also performs a tap selection adjustment procedure to determine a "finally-identified" delay line output signal 750. This determination is made based on the length of an "inherent delay" associated with stage-1 702. As used herein, the term "inherent delay," as it relates to any stage (e.g., stage-1 702 or stage-2 703) other than a final stage (e.g., stage-N 704), includes: 7) an "inherent interface circuit delay" between an input (e.g., input 733) and an output (e.g., output 734) of that stage's interface circuit (e.g., stage-1 interface circuit 730); 2) any "inherent start up delay" of a next stage (e.g., stage-2 703); and 3) any "intentional delay adjustment" applied (in either direction) to ensure that a subsequent stage is able to delay the signal to a finer alignment resolution. Regarding the "inherent start up delay," for delay lines having certain designs, the delay applied between the input to the delay line and the output of the first delay element (e.g., the tap associated with the first delay element's output) may be significantly larger than the delay applied by any subsequent delay element in the delay line. The difference between the apparent delay applied by the first delay element (e.g., the delay between the delay line's input and the output of the first delay element) and the actual delay applied by a subsequent delay element is referred to herein as the inherent start up delay of the delay line. In addition, regarding the "intentional delay adjustment" applied by a delay line, the finally-identified tap of any stage (e.g., stage-1 702 or stage-2 703) other than a final stage (e.g., stage-N 704) is selected to ensure that enough of a time difference is present between the target edges for alignment (e.g., alignment error 322, FIG. 9, described later) to allow any subsequent delay stage to further delay its respective input signal to a finer alignment resolution. In contrast with preceding stages, the "inherent delay" of the final stage (e.g., stage-N 704) includes only the delay between the input (e.g., input 737) and the output (e.g., output 738) of that stage's interface circuit (e.g., stage-N interface circuit 732).

In one embodiment, stage-1 tap selection circuit 720 may select the finally-identified delay line output signal 750 to be a signal 750 having a smaller delay, when compared with the delay of the initially-identified delay line output signal 750. The difference between the first delay associated with the initially-identified delay line output signal 750 and the finally-identified delay line output signal 750 is related to the inherent delay associated with stage-1 702. An identifier of the tap associated with the finally-identified delay line output signal 750 may be considered to be a "finally-identified" tap.

Once the finally-identified delay line output signal 750 has been determined, the stage-1 tap selection circuit 720 provides a control signal 760 to the stage-1 interface circuit 730, which indicates the finally-identified tap. Stage-1 interface circuit 730 is adapted to receive the delay line output signals 750, and to allow only one of the delay line output signals 750 to be output (at the delay stage output 716) as the stage-1 output signal 741. In one embodiment, the delay line output signal 750 that is output as the stage-1 output signal 741 corresponds to the delay line output signal 750 corresponding to the finally-identified tap indicated in control signal 760. Accordingly, provision of the control signal 760 causes the stage-1 interface circuit 730 to pass the delay line output signal 750 corresponding to the finally-identified tap to the delay stage output 716.

As discussed above, stage-1 702 has an associated inherent delay. Because the inherent delay roughly equals the delay differential between the initially-identified and finally-identified delay line output signals 750, the stage-1 output signal 741 should more closely align with the input signal 740 in the desired manner than it would if the inherent delay of stage-1 702 were left uncompensated for. This characteristic of the various embodiments makes it possible for the multiple-stage edge alignment circuit 700 to produce highly accurate alignment, despite the inherent delays associated with the stages.

Continuing through the remainder of circuit 700, the stage-1 output signal 741 is received by a delay stage input 714 of stage-2 703. More particularly, the stage-1 output signal 741 is received by stage-2 delay line 711. Stage-2 delay line 711 is similar in configuration to stage-1 delay line 710, in that stage-2 delay line 711 includes a plurality of series-connected delay elements, each of which applies a fixed-width delay, d2, which has a second resolution or width. In one embodiment, the resolution of the delay elements of the stage-2 delay line 711 is finer than the resolution of the delay elements of the stage-1 delay line 710. In other words, the length of delay, d1, of the delay elements of the stage-1 delay line 710 is longer than the length of delay, d2, of the delay elements of the stage-2 delay line 711. In one embodiment the fixed-width delay, d2, is less than fifty percent of the fixed-width delay, d1. According to another embodiment the fixed-width delay, d2, is less than ten percent of the fixed-width delay, d1. In stage-2 delay line 711, the sequential application of the fixed-width delays results in a plurality of delay line output signals 751 accessible at a tap at the output of each delay element. In one embodiment, in order to achieve the smaller delay, d2, stage-2 delay line 711 may have a different circuit structure (e.g., phase interpolation) from the stage-1 delay line 710. As discussed previously, the inherent start up delay for stage-2 delay line 711 is compensated for by stage-1 tap selection circuit 720 in the selection of the finally-identified tap of the stage-1 delay line 710.

The delay line output signals 751 are received at inputs to stage-2 tap selection circuit 721 and stage-2 interface circuit 731, as shown in FIG. 7. Stage-2 tap selection circuit 721 also receives input signal 740. In a substantially similar manner as the stage-1 tap selection circuit 720, the stage-2 tap selection circuit 721 is adapted to determine which of the delay line output signals 751 most closely corresponds to a signal having the desired alignment with input signal 740. The determination results in an initially-identified delay line output signal 751.

In a substantially similar manner as the stage-1 tap selection circuit 720, stage-2 tap selection circuit 721 also performs a tap selection adjustment procedure to determine a finally-identified delay line output signal 751. This determination is made based on the length of an inherent delay associated with stage-2 703. Once the finally-identified delay line output signal 751 has been determined, the stage-2 tap selection circuit 721 provides a control signal 761 to the stage-2 interface circuit 731, which indicates the finally-identified tap. Stage-2 interface circuit 731 is adapted to receive the delay line output signals 751 at an input 735, and to allow only one of the delay line output signals 751 to be output (at the stage-2 interface circuit output 736, which is also the delay stage output 717) as the stage-2 output signal 742. In one embodiment, the delay line output signal 751 that is output as the stage-2 output signal 742 corresponds to the delay line output signal 751 corresponding to the finally-identified tap indicated in control signal 761.

Between stage-2 703 and stage-N 704, zero or more intervening stages may be present. Each intervening stage may be adapted to function substantially similarly to preceding stages, except that the resolution of any given stage is relatively fine, when compared with the resolutions of preceding stages. In other words, the delay elements of a particular stage are adapted to apply relatively shorter, fixed-width delays than are the delay elements of any preceding stage. This characteristic of the various embodiments enables edge alignment to be performed to any level of accuracy, where more accuracy may be achieved using more stages.

Eventually, the output signal 743 from the immediately preceding stage (e.g., stage 2 704 or an intervening stage, not illustrated) is received by a delay stage input 715 of stage-N 704. More particularly, the output signal 743 is received by stage-N delay line 712. Stage-N delay line 712 is similar in configuration to stage-1 delay line 710, in that stage-N delay line 712 includes a plurality of series-connected delay elements, each of which applies a fixed-width delay, dN. However, as indicated above, the resolution of the delay elements of the stage-N delay line 712 is finer than the resolution of the delay elements of the stage-2 delay line 711 or any other intervening delay lines (not illustrated). In stage-N delay line 712, the sequential application of the fixed-width delays results in a plurality of delay line output signals 752 accessible at a tap at the output of each delay element. As discussed previously, the inherent start up delay for stage-N delay line 712 is compensated for by the tap selection circuit of the immediately preceding stage (e.g., stage-2 tap selection circuit 721, if no stages are intervening) in its selection of the finally-identified tap of the delay line of the immediately preceding stage (e.g., stage-2 delay line 711, if no stages are intervening).

The delay line output signals 752 are received at inputs to stage-N tap selection circuit 722 and stage-N interface circuit 732, as shown in FIG. 7. Stage-N tap selection circuit 722 also receives input signal 740. In a substantially similar manner as the stage-1 tap selection circuit 720, the stage-N tap selection circuit 722 is adapted to determine which of the delay line output signals 752 most closely corresponds to a signal having the desired alignment with input signal 740. The determination results in an initially-identified delay line output signal 752.

In a substantially similar manner as the stage-1 tap selection circuit 720, stage-N tap selection circuit 722 also performs a tap selection adjustment procedure to determine a finally-identified delay line output signal 752. This determination is made based on the length of an inherent delay between an input 737 and an output 738 of stage-N interface circuit 732. However, in contrast with preceding stages (e.g., stage-1 702 and stage-2 703), the inherent delay of stage-N 704 includes only the delay between the input 737 and the output 738 of the stage-N interface circuit 732 (e.g., because there is no next stage, the inherent delay does not include any inherent start up delay of any next stage). In addition, the finally-identified tap of stage-N 704 does not need to be selected to ensure that a time difference is present between the target edges for alignment, since stage-N 704 corresponds to the final and finest alignment resolution.

Once the finally-identified delay line output signal 752 has been determined, the stage-N tap selection circuit 722 provides a control signal 762 to the stage-N interface circuit 732, which indicates the finally-identified tap. Stage-N interface circuit 732 is adapted to receive the delay line output signals 752, and to allow only one of the delay line output signals 752 to be output (at the delay stage output 718) as the stage-N output signal 744. In one embodiment, the delay line output signal 752 that is output as the stage-N output signal 744 corresponds to the delay line output signal 752 corresponding to the finally-identified tap indicated in control signal 762. The delay line output signal 752 that is output by stage-N interface circuit 732 corresponds to the ultimate output signal 744 of the edge alignment circuit 700.

As the above description indicates, the first stage (e.g., stage-1 702) within a multiple-stage edge alignment circuit (e.g., circuit 700) produces an output signal (e.g., output signal 741) that is relatively coarsely aligned with the input signal (e.g., input signal 740). Any subsequent stages (e.g., stage-2 703 and stage-N 704) produce output signals (e.g., output signals 742, 744) that are relatively more finely aligned (i.e., more accurately aligned) with the input signal, where the output signal of the final stage (e.g., output signal 744) is the most finely aligned (i.e., the most accurately aligned) with the input signal.

Figure 8:
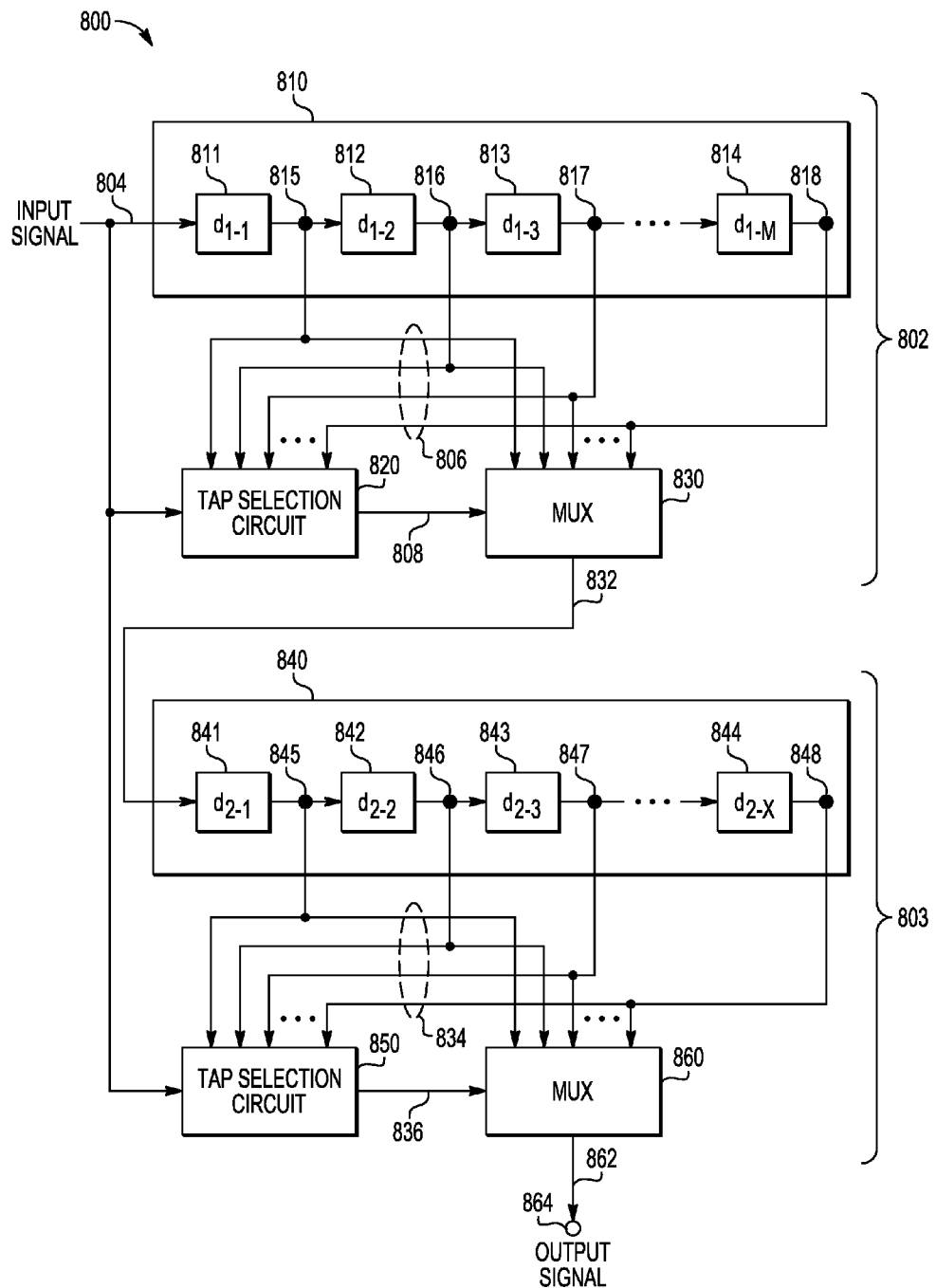
FIG. 8 is schematic diagram illustrating an example implementation of the multiple-stage edge alignment circuit of FIG. 7 as a two-stage edge alignment circuit in accordance with at least one embodiment of the present disclosure.

A generalized depiction of a multiple-stage edge alignment circuit 700 having a plurality, N, of delay stages has been described in conjunction with FIG. 7. In order to provide more specific detail regarding the configuration and operation of various embodiments, FIG. 8 illustrates a simplified schematic diagram of a two-stage edge alignment circuit 800 adapted to process an input clock signal 802 (e.g., the MCLK or MCLK_B signal or the data strobe signal DQS). This same process may be performed for any of the other signals subjected to duty cycle correction in the memory controller 102 (e.g., the data signaling DQ<0:n−1>, the address signaling ADDR, and the command signaling CMD). FIG. 8 will be described simultaneously with FIG. 9, which illustrates an example of a timing diagram of signals that may be processed by the two-stage edge alignment circuit of FIG. 8, in accordance with an example embodiment.

Figure 9:
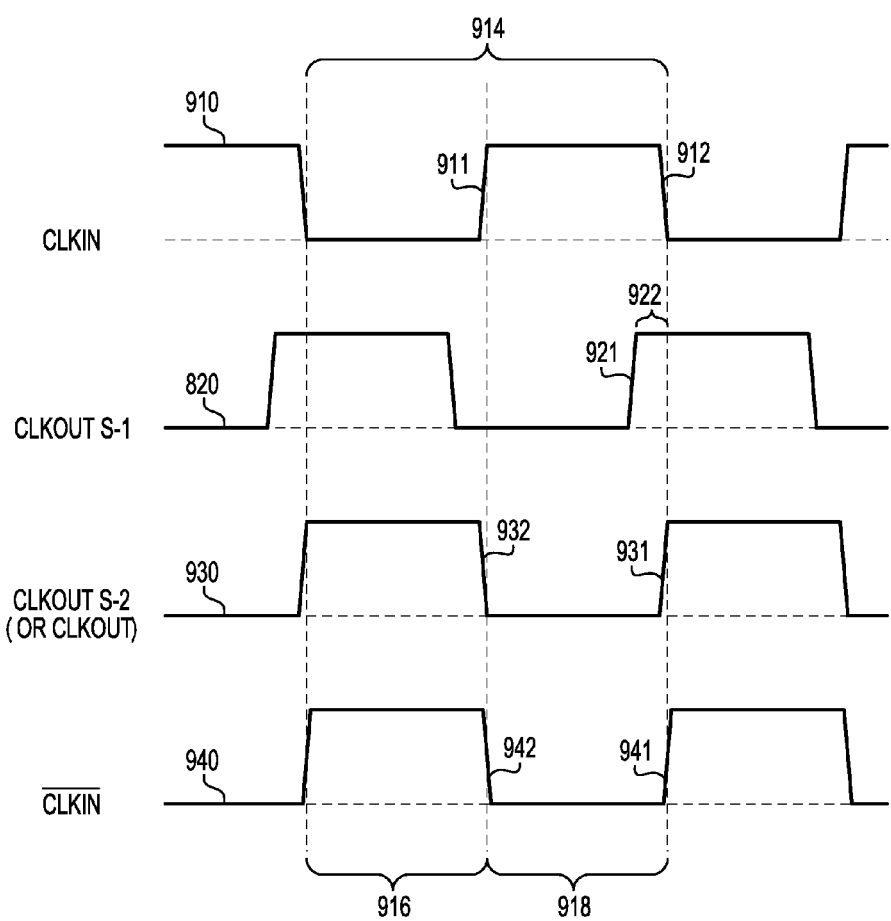
FIG. 9 is a timing diagram of signals that may be processed by the two-stage edge alignment circuit of FIG. 8 in accordance with at least one embodiment of the present disclosure.

Edge alignment circuit 800 is particularly adapted to align a first type of transition edge of an input signal (e.g., a falling edge 912 of a clock signal 910, FIG. 9) with an opposite type of transition edge of a delayed version of the input signal (e.g., a rising edge 921, 931 of delayed signals 920, 930, FIG. 9). As used herein, the term "transition edge" may refer to either a rising edge (i.e., low-to-high transition) or a falling edge (i.e., high-to-low transition), and an "opposite" type of transition edge may refer to a type of a transition edge that transitions in an opposite direction (i.e., a falling edge or a rising edge, respectfully). It is to be understood that, in other embodiments, an edge alignment circuit may be adapted to align the same types of transition edges (e.g., a rising edge of an input signal with a rising edge of a delayed signal, or a falling edge of an input signal with a falling edge of a delayed signal). In addition, although edge alignment circuit 800 is described as aligning edges of signals that are essentially square waves having a particular duty cycle, it is to be understood that an edge alignment circuit may be adapted to align portions of a sinusoidal or other time-varying type of signal, according to other embodiments. Finally, although edge alignment circuit 800 is described in terms of aligning edges of an input clock signal (e.g., clock signal 910, FIG. 9) with a delayed version of the input clock signal (e.g., delayed signals 920 and 930, FIG. 9), it is to be understood that edge alignment circuits may be adapted to align other types of time-varying signals, in other embodiments.

Edge alignment circuit 800 includes two delay stages 802, 803. Although only two delay stages 802, 803 are illustrated in FIG. 8, it is to be understood that edge alignment circuits may have more than two delay stages, in other embodiments. The illustrated delay stages 802, 803 are referred to herein as "stage-1" 802 and "stage-2" 803. Each stage 802, 803 includes a delay line 810, 840, a tap selection circuit 820, 850, multiplexer (MUX) 830, 860, and possibly additional circuit (not illustrated) associated with MUX 830, 860.

In one embodiment, an input clock signal (CLKIN) 804 (FIG. 8), 910 (FIG. 9) is received by stage-1 802. More particularly, the input clock signal 804 is received by stage-1 delay line 810. As shown in FIG. 9, the input clock signal 910 is a time-varying, periodic signal having a period 914 that defines the clock frequency. For purposes of example only, the input clock signal 910 may be generated at a frequency of about 1 gigahertz (GHz), which corresponds to a period 914 of about 1000 picoseconds (ps). It is to be understood that, in other embodiments, the input clock signal 910 may be generated at any other frequency (e.g., frequencies in a range of 10 Hz to 100 GHz).

Stage-1 delay line 810 includes a number, M, of series-connected delay elements 811, 812, 813, 814, each of which applies a fixed-width delay, d1, having a first resolution. In one embodiment, the number, M, of delay elements 811-814 may be in a range of about 5 to about 90 elements, although delay line 810 may include more or fewer delay elements, as well. The first delay element 811 applies the delay to the input clock signal 804, and outputs the delayed clock signal to the second delay element 812. The second and each subsequent delay element 812-814 consecutively apply the fixed-width delay to the already delayed version of the clock signal that it receives. This sequential application of the fixed-width delays results in a plurality of delay line output signals 806 accessible at a tap 815, 816, 817, 818 at the output of each delay element 811-814. Each tap 815-218 may be identified, for example, with an integer number. As used herein, a tap that occurs "earlier" in a delay line than another tap refers to a tap that is positioned closer to the delay line input. For example, in stage-1 delay line 810, tap 815 occurs earlier than tap 818.

Stage-1 tap selection circuit 820 and stage-1 MUX 830 are coupled to taps 815-218, and accordingly, the delay line output signals 806 are received at inputs to stage-1 tap selection circuit 820 and stage-1 MUX 830, as shown in FIG. 8. Stage-1 tap selection circuit 820 also receives input clock signal 804. Stage-1 tap selection circuit 820 is adapted to determine which of the delay line output signals 806 most closely corresponds to a signal having a desired alignment with input clock signal 804 at the output of stage-1 802. According to the embodiment described herein, stage-1 tap selection circuit 820 selects a particular delay line output signal 806 as the signal that has rising edges (e.g., rising edges 921, FIG. 9) that most closely align with falling edges (e.g., falling edges 912, FIG. 9) of the input clock signal 804 after compensation for inherent delays associated with stage-1 802, as will be described in more detail below. Alternatively, stage-1 tap selection circuit 820 may be adapted to determine which of the delay line output signals 806 has falling edges that most closely align with rising edges of the input clock signal 804 after application of the inherent delays associated with stage-1 802, according to another embodiment. In still other embodiments, Stage-1 tap selection circuit 820 may identify a particular delay line output signal 806 based on some other criteria of alignment with input clock signal 804.

As described previously in conjunction with FIG. 1, the identification of a delay line output signal 806 having a desired alignment with input clock signal 804 may be made, for example, by comparing and/or correlating input clock signal 804 (or an inverted or otherwise processed version thereof) with each of the delay line output signals 806. An initially-identified delay line output signal 806 includes the output signal 806 that is closest to having the desired alignment. The tap 815-218 associated with the initially-identified delay line output signal 806 may be considered to be an initially-identified tap. The initially-identified tap may be an integer number, for example, that indicates which tap 815-218 corresponds with the initially-identified delay line output signal 806.

In one embodiment, stage-1 tap selection circuit 820 also performs a tap selection adjustment procedure to determine a finally-identified delay line output signal 806. This determination is made based on the length of the inherent delay associated with stage-1 802 (e.g., an inherent interface circuit delay of the stage-1 MUX 830 and other circuitry, any inherent start up delay of stage-2 803, and any intentional delay adjustment applied (in either direction) to ensure that stage-2 803 is able to delay the signal to a finer alignment resolution). More particularly, stage-1 tap selection circuit 820 may select the finally-identified delay line output signal 806 to be a signal 806 having a smaller delay, when compared with the delay of the initially-identified delay line output signal 806. The difference between the first delay associated with the initially-identified delay line output signal 806 and the finally-identified delay line output signal 806 roughly equals the inherent delay associated with stage-1 802.

For example, assume that each delay element 811-814 applies a fixed-width delay of approximately 150 ps, the inherent delay of MUX 830 and other interface circuit is known to be approximately 120 ps, and the start up delay of stage-2 803 is approximately 50 ps. To align falling edges of an input clock signal 804 having approximately a 1000 ps period with rising edges of a delayed version of the input clock signal, a delay of approximately 500 ps at the output of stage-1 802 would be desired. A version of the input clock signal 804 that is delayed by an amount of time that is closest to about 500 ps would occur at the output of the third delay element 813 (for a delay of about 450 ps), since the cumulative delay applied to the input signal at that point would be 3×150 ps (i.e., the delay element number (3) times the fixed-width delay (150 ps)). Accordingly, the stage-1 tap selection circuit 820 may select the output signal 806 produced at the tap of the third delay element to be the initially-identified delay line output signal 806.

However, because MUX 830 and other associated circuit inherently would apply an additional delay of about 120 ps to the output signal 806 produced at the tap for the third node, and because the stage-2 delay line 840 has an inherent start up delay of about 50 ps, according to the example, selection of the third node's output signal 806 may cause the resulting output signal 832 of stage-1 802 effectively to have about 170 ps of additional and undesirable misalignment with the input clock signal 804. In one embodiment, the potential for this misalignment is eliminated by determining the finally-identified delay line output signal 806 and the finally-identified tap 815-218 to be a number of taps earlier than the third tap 817. In one embodiment, the number of taps corresponding to the adjustment equals the inherent delay of stage-1 802 (e.g., 170 ps) divided by the fixed-width delay of each delay element 811-814 (e.g., 150 ps), and rounded to the nearest integer. This would result in an adjustment of one (1) tap toward lesser cumulative delay, in the above-given example. Accordingly, the finally-identified delay line output signal 806 would correspond to the output signal 806 produced at the tap 816 of the second delay element 812, rather than the third delay element 813. The tap 816 of the second delay element 812 would be the finally-identified tap. In this example, sufficient misalignment to ensure that stage-2 803 is able to delay the signal to a finer alignment resolution already is present, and therefore an additional tap adjustment would not be warranted. However, when the misalignment is not sufficient to ensure that stage-2 803 is able to delay the signal further, tap selection circuit 820 may instead select an additional tap toward lesser cumulative delay (e.g., it may select the first tap 815).

Stage-1 tap selection circuit 820 provides a control signal 808 to stage-1 MUX 830, indicating the finally-identified delay line output signal 806 or the finally-identified tap 815-818. Responsive to the control signal 808, stage-1 MUX 830 outputs the indicated delay line output signal 806 (e.g., the second signal 806) as the ultimate output signal 832 of stage-1 802. As a result of the tap selection adjustment procedure performed by stage-1 tap selection circuit 820, the output signal 832 may have edges that are more closely aligned with edges of the input clock signal 804 than they would be if stage-1 tap selection circuit 820 did not perform the tap selection adjustment procedure.

For example, referring also to FIG. 9, an output signal 920 (indicated as CLKOUT S-1) corresponding to output signal 832 reflects the delay line output signal 806 having rising edges 921 that are most closely aligned with the falling edges 912 of the input clock signal 910, despite the inherent delays of stage-1 802. In one embodiment, the fixed-width delay of each delay element 811-814 of stage-1 802 may have a resolution that may produce misaligned target edges, according to design specifications. For example, FIG. 9 illustrates that an alignment error 922 exists between the falling edges 912 of the input clock signal 910 and the rising edges 921 of the stage-1 output signal 920. In one embodiment and as discussed previously, some misalignment between target edges is desirable in each stage (e.g., stage-1 802) other than a final stage (e.g., stage-2 803) to ensure that enough of a time difference is present between the target edges (e.g., alignment error 922) to allow any subsequent delay stage (e.g., stage-2 803) to further delay its respective input signal to a finer resolution. Accordingly, stage-1 tap selection circuit 820 is adapted to select the finally-identified tap 815-818 to ensure an intentional misalignment. In contrast, the tap selection circuit of the final stage (e.g., stage-2 tap selection circuit 850, discussed later) would not select a finally-identified tap 841-844 to ensure an intentional misalignment.

Continuing through the remainder of circuit 800, the stage-1 output signal 832 is received by stage-2 803. More particularly, the stage-1 output signal 832 is received by stage-2 delay line 840. Stage-2 delay line 840 is similar in configuration to stage-1 delay line 810, in that stage-2 delay line 840 includes a number, X, of series-connected delay elements 841, 842, 843, 844, each of which applies a fixed-width delay, d2. However, in one embodiment, the resolution of the delay elements of the stage-2 delay line 840 is finer than the resolution of the delay elements of the stage-1 delay line 810. In other words, the delay, d1, of the delay elements of the stage-1 delay line 810 is longer than the delay, d2, of the delay elements of the stage-2 delay line 840. The number, X, of delay elements 841-844 in stage-2 delay line 840 may be the same or different from the number, M, of delay elements 811-814 in stage-1 delay line 810. In stage-2 delay line 840, the sequential application of the fixed-width delays results in a plurality of delay line output signals 834 accessible at a tap 845, 846, 847, 848 at the output of each delay element 841-844. As discussed previously, the inherent start up delay for stage-2 delay line 840 is compensated for by stage-1 tap selection circuit 820 in its selection of the finally-identified tap of stage-1 delay line 810.

The delay line output signals 834 are received at inputs to stage-2 tap selection circuit 850 and stage-2 MUX 860, as shown in FIG. 8. Stage-2 tap selection circuit 850 also receives input clock signal 804. In a substantially similar manner as the stage-1 tap selection circuit 820, the stage-2 tap selection circuit 850 is adapted to determine which of the delay line output signals 834 most closely corresponds to a signal having the desired alignment with input clock signal 804. The determination results in an initially-identified delay line output signal 834 and an initially-identified tap 845-848.

In a substantially similar manner as the stage-1 tap selection circuit 820, stage-2 tap selection circuit 850 also performs a tap selection adjustment procedure to determine a finally-identified delay line output signal 834 and a finally-identified tap 845-248. This determination is made based on the length of an inherent delay associated with stage-2 MUX 860 and other interface circuitry between the output of stage-2 delay line 840 and the output 864 of the edge alignment circuit 800. However, in contrast with stage-1 802, the inherent delay of stage-2 803 includes only the delay associated with stage-2 MUX 860 and other interface circuitry (e.g., because there is no next stage, the inherent delay does not include any inherent start up delay of any next stage). In addition, the finally-identified tap of stage-2 803 does not need to be selected to ensure that a time difference is present between the target edges for alignment, since stage-2 803 corresponds to the final and finest alignment resolution.

Once the finally-identified delay line output signal 834 has been determined, the stage-2 tap selection circuit 850 provides a control signal 836 to the stage-2 MUX 860, which indicates the finally-identified tap 845-248. Stage-2 MUX 860 is adapted to receive the delay line output signals 834, and to allow only one of the delay line output signals 834 to be output as the stage-2 output signal 862. In one embodiment, the delay line output signal 834 that is output as the stage-2 output signal 862 corresponds to the delay line output signal 834 corresponding to the finally-identified tap 845-848 indicated in control signal 836.

For example, referring also to FIG. 9, an output signal 930 (indicated as CLKOUT S-2 or CLKOUT) corresponding to output signal 862 reflects the delay line output signal 834 having rising edges 931 that are even more closely aligned with the falling edges 912 of the input clock signal 910, despite the inherent delays applied by MUX 860 and other interface circuitry. In one embodiment, the fixed-width delay of each delay element 841-844 of stage-2 803 may have a resolution that may produce sufficiently aligned signals, according to design specifications. For example, FIG. 9 illustrates that no significant alignment error exists between the falling edges 912 of the input clock signal 910 and the rising edges 931 of the stage-2 output signal 930. Said another way, stage-1 802 produces an output signal 832, 920 that is relatively coarsely aligned with the input clock signal 804, 910, and stage-2 803 produces an output signal 862, 930 that is relatively more finely aligned (i.e., more accurately aligned) with the input clock signal 804, 910. As will be described in more detail below, the output signal of the final stage of the edge alignment circuit (e.g., output signal 862 of stage-2 803) may be used to provide alignment information for other circuit that is designed to measure signal characteristics and/or to perform signal correction, filtering or other procedures (e.g., duty cycle measurement and/or correction, jitter measurement and/or correction, and digital filtering, among other things).

Figure 10:
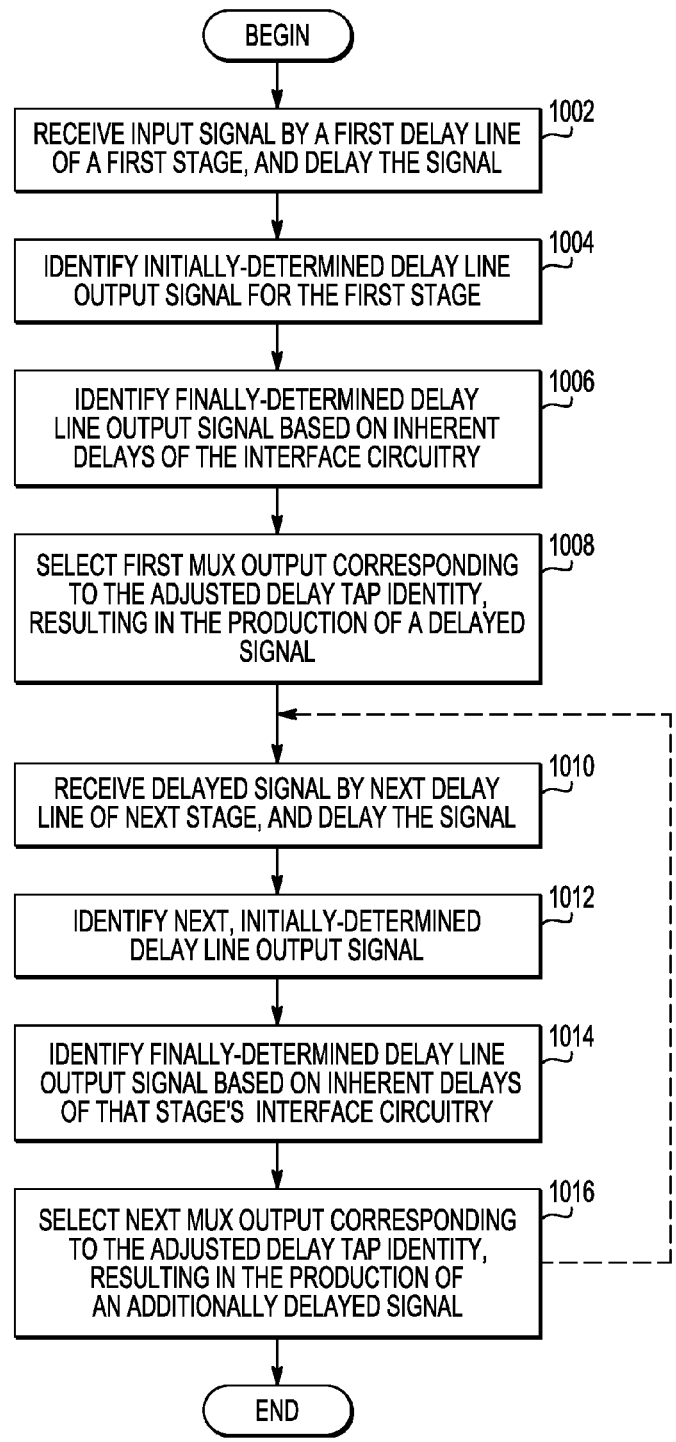
FIG. 10 is a flow diagram illustrating a method for duty cycle correction in the memory controller of the memory system of FIG. 1 in accordance with at least one embodiment of the present disclosure.

FIG. 10 is a flowchart of a method for performing a multiple-stage edge alignment process, in accordance with an example embodiment. The method may be performed, for example, by a multiple-stage edge alignment apparatus such as illustrated in FIG. 7 or 8, according to various embodiments. The method begins, in block 402, when an input signal (e.g., signal 740, FIG. 7 or 804, FIG. 8) is received by a first delay line of a first stage of the multiple-stage edge alignment apparatus (e.g., stage-1 delay line 710, FIG. 7 or stage-1 delay line 810, FIG. 8). As discussed previously, the input signal may be any of the signals of the memory controller 102 of the memory system 100 described above. The received signal is delayed by the plurality of elements of the delay line, as discussed previously.

In block 1004, a tap of the first delay line is identified (e.g., by tap selection circuit 720, FIG. 7 or 820, FIG. 8), which corresponds to a coarsely-aligned output signal of the first stage (e.g., signal 741, FIG. 7 or 832, FIG. 8). As discussed in detail above, the tap of the first delay line may be identified by first identifying an initially-identified delay line output signal (e.g., one of signals 750, FIG. 7 or 806, FIG. 8) that has a characteristic of being most closely aligned, in a desired manner, with the input signal (e.g., the rising edge of the delayed signal is more closely aligned with the falling edge of the input signal than for any other delayed signal produced by the first delay line). After selecting the initially-identified delay line output signal and a corresponding initially-identified tap, a finally-identified delay line output signal and a finally-identified tap are identified, in block 1006. In one embodiment, this may include identifying a number of taps that corresponds with the inherent delay associated with the first stage, and then determining an offset from the initially-identified tap that corresponds to the inherent delay. In block 1008, an interface circuit output (e.g., a MUX output) is selected by providing a control signal to the interface circuit, which indicates the finally-identified tap. This results in the production of a delayed signal at the output of the first stage.

In block 1010, the delayed signal at the output of the first stage (e.g., stage-1 delay line 710, FIG. 7 or stage-1 delay line 810, FIG. 8) is received by a "next" delay line of a next stage of the multiple-stage edge alignment apparatus. In block 1012 a tap of the next delay line is identified (e.g., by tap selection circuit 721, FIG. 7 or 850, FIG. 8), which corresponds to a more finely-aligned output signal of the stage (e.g., signal 742, FIG. 7 or 862, FIG. 8). The tap of the next delay line may be identified by first selecting an initially-identified delay line output signal (e.g., one of signals 751, FIG. 7 or 834, FIG. 8)

that has a characteristic of being most closely aligned, in a desired manner, with the input signal. After selecting the initially-identified delay line output signal and a corresponding initially-identified tap, a finally-identified delay line output signal and a finally-identified tap are identified, in block 1014. In one embodiment, this may include determining a number of taps that corresponds with the inherent delay associated with that stage, and then determining an offset from the initially-identified tap that corresponds to the inherent delay. In block 1016, an interface circuit output (e.g., a MUX output) is selected by providing a control signal to the interface circuit indicating the finally-identified tap. This results in the production of a delayed signal at the output of the stage.

In a two-stage, edge alignment circuit (e.g., as depicted in FIG. 8), the delayed signal corresponds to the output signal of the edge alignment circuit. In an edge alignment circuit that includes more than two stages (e.g., as depicted in FIG. 7), blocks 1010-1016 may be repeated for each additional, subsequent stage, as indicated by the dashed line in FIG. 10. Once an output signal (e.g., signal 744, FIG. 7 or 862, FIG. 8) has been produced at the output of the edge alignment circuit, the method may end.

Figure 11:
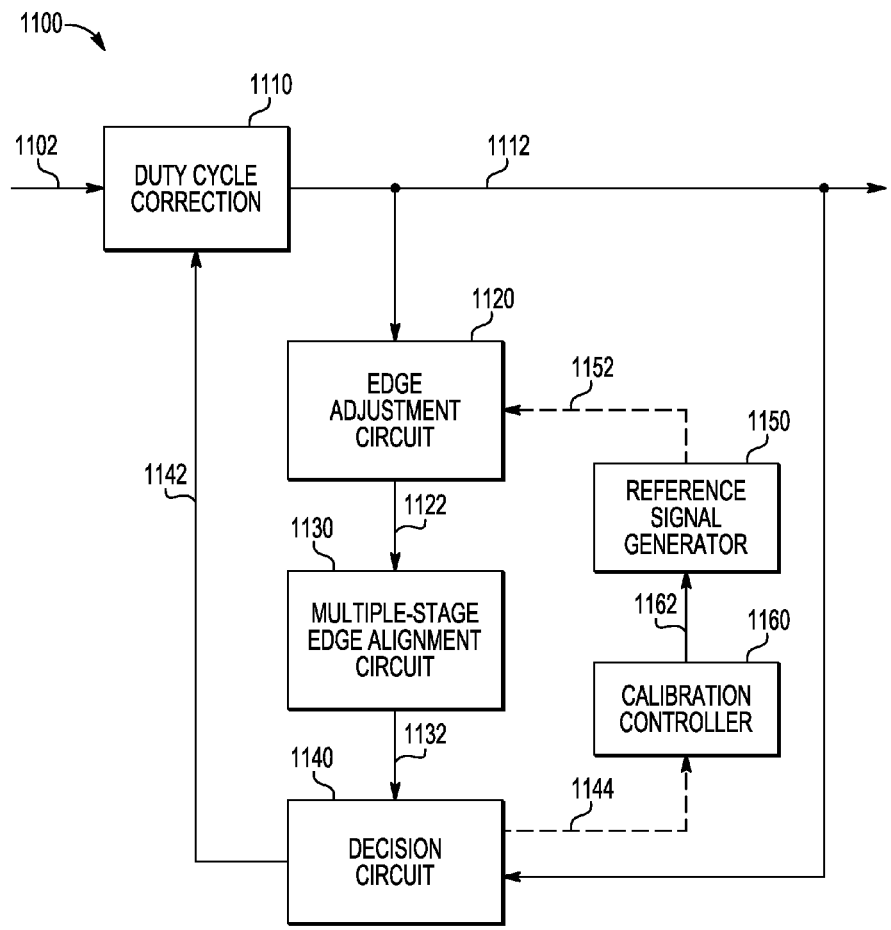
FIG. 11 is a block diagram of a duty cycle correction module of the memory controller of the memory system of FIG. 1 in accordance with at least one embodiment of the present disclosure.

As mentioned previously, the output of the multiple-stage, edge alignment circuit may be used for any of a number of measurements, calculations, signal processing tasks, and/or signal corrections. For example, FIG. 11 illustrates a simplified block diagram of a duty cycle correction calibration module 1100 (corresponding to the duty cycle correction calibration module 146 of FIG. 1) with a multiple-stage edge alignment circuit 1130, in accordance with an example embodiment. Duty cycle correction calibration module 1100 includes a duty cycle correction module 1110 and a duty cycle evaluation module (corresponding to the DC evaluation module 147, FIG. 1) that comprises an edge adjustment circuit 1120, a multiple-stage edge alignment circuit 1130, and a decision circuit 1140. Duty cycle correction calibration module 1100 also may include a reference signal generator 1150 and a calibration controller 1160, which are useful during a post-fabrication calibration procedure, and which will be described in more detail later in conjunction with FIG. 13.

An input signal 1102 is first received by duty cycle correction module 1110 (corresponding to, for example, the DCC modules 148, 150, 152, and 154, FIG. 1), which is adapted to perform signal processing on the input signal 1102 in order to correct for duty cycle errors that may be identified by decision circuit 1140, as will be described in more detail below. For ease of description, assume initially that no correction is performed. Regardless, the output of the duty cycle correction module 1110 will be referred to below as a "corrected" input signal 1112. The corrected input signal 1112 corresponds to the output signal of the duty cycle correction calibration module 1100.

In order to determine whether and how the duty cycle correction module 1110 should correct the duty cycle, the corrected input signal 1112 is received and processed by a "duty cycle evaluation circuit," which includes edge adjustment circuit 1120, multiple-stage edge alignment circuit 1130, and decision circuit 1140. In one embodiment, edge adjustment circuit 1120 is adapted to adjust a transition edge of corrected input signal 1112 either forward or backward in time by a "calibrated edge adjustment time" in order to compensate for inherent duty cycle errors in the duty cycle evaluation circuit. The calibrated edge adjustment time is determined during a calibration procedure, as will be described in more detail in conjunction with FIG. 13. Edge adjustment circuit 1120 produces a signal that is referred to herein as an "edge-adjusted input signal" 1122.

The edge-adjusted input signal 1122 is received by multiple-stage, edge alignment circuit 1130 (e.g., circuit 700, FIG. 7 or 800, FIG. 8). In one embodiment, edge alignment circuit 1130 is adapted to generate an output signal 1132 that is aligned with the edge-adjusted input signal 1122 in a desired manner, as described above in detail and in accordance with the various embodiments. For example, as discussed previously, output signal 1132 may have its rising edges (e.g., rising edges 931, FIG. 9) aligned with the falling edges (e.g., falling edges 912, FIG. 9) of the edge-adjusted input signal 1122, in an embodiment. In one embodiment, edge alignment circuit 1130 also may apply a "calibrated delay" to the edge-adjusted input signal in order to compensate for inherent delay errors in the duty cycle evaluation circuit. The calibrated delay also is determined during the calibration procedure, as will be described in more detail in conjunction with FIG. 13.

Decision circuit 1140 receives the corrected input signal 1112 and the output signal 1132 of the edge alignment circuit 1130. Decision circuit 1140 is adapted to evaluate the corrected input signal 1112 in light of the output signal 1132 in order to determine whether the duty cycle is correct (e.g., substantially equal to 50 percent) or incorrect (e.g., not substantially equal to 50 percent). In one embodiment, decision circuit 1140 may invert either the input signal 1112 or the output signal 1132 and evaluate the alignment of other edges of the signals, which were not previously aligned by the edge alignment circuit 1130. For example, referring again to FIG. 9, signal 940 represents an inverted version of input signal 310 (e.g., an inverted version of input signal 1112). Although the rising edges 331, 341 of the output signal 330 and the inverted input signal 940 remain aligned by virtue of the alignment process performed by the edge alignment circuit (e.g., circuit 700, FIG. 1, 800, FIG. 8 or 1130, FIG. 11), the falling edges 932, 942 of the output signal 930 and the inverted signal 940 are not necessarily aligned.

When the decision circuit 1140 determines that the falling edges are aligned within a specified tolerance (e.g., within 1 ps or some other value), then decision circuit 1140 may determine that the duty cycle is correct. However, when the decision circuit 1140 determines that the falling edges are not aligned within a specified tolerance, then the decision circuit 1140 may determine that the duty cycle is not correct. For example, the falling edges 932, 942 may not be aligned when the portion 918 of the period of the inverted signal 940 during which the signal is high is significantly longer or shorter than the portion 918 of the period of the inverted signal 340 during which the signal is low.

In one embodiment, when decision circuit 1140 determines that the duty cycle is correct (e.g., the duty cycle is substantially 50 percent), decision circuit 1140 may produce a decision result signal 1142, which indicates that the current duty cycle correction being performed by duty cycle correction module 1110 should not be changed. When decision circuit 1140 determines that the duty cycle is too low (e.g., the duty cycle is significantly less than 50 percent), decision circuit 1140 may produce a decision result signal 1142, which indicates that the duty cycle correction module 1110 should adjust its current level of correction in a manner that the duty cycle of the corrected input signal 1112 is increased. Conversely, when decision circuit 1140 determines that the duty cycle is too high (e.g., the duty cycle is significantly greater than 50 percent), decision circuit 1140 may produce a decision result signal 1142, which indicates that the duty cycle correction module 1110 should adjust its current level of correction in a manner that the duty cycle of the corrected input signal 1112 is decreased. The duty cycle evaluation and correction continues to be performed during operation to dynamically increase or decrease the duty cycle of the input signal 1112 as needed.

Figure 12:
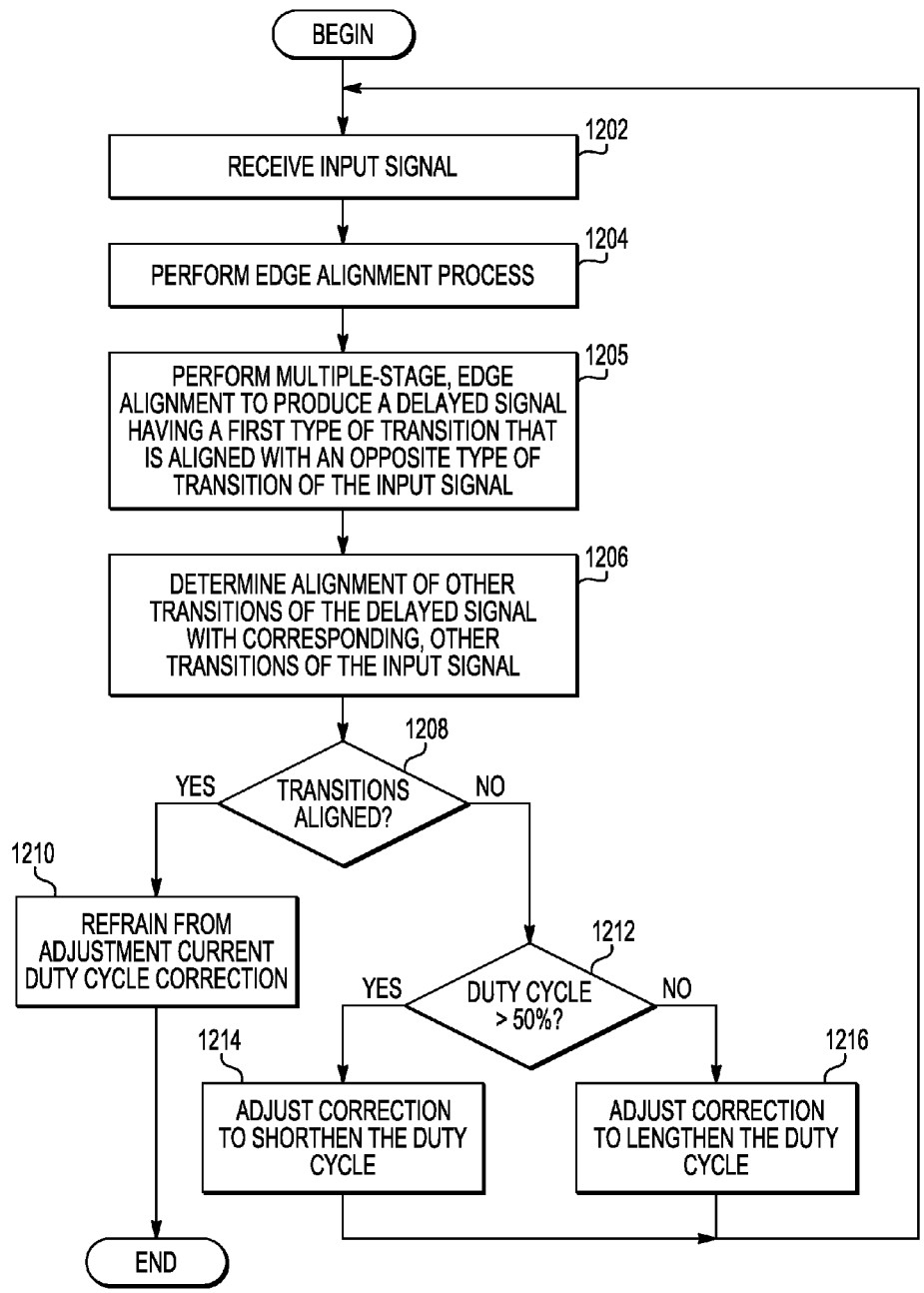
FIG. 12 is a flowchart of a method for performing duty cycle correction of the memory controller of the memory system of FIG. 1 in accordance with at least one embodiment of the present disclosure.

FIG. 12 is a flowchart of a method for performing duty cycle correction, in accordance with an example embodiment. The method may be performed, for example, by the duty cycle correction calibration module 1110 and discussed in conjunction with FIG. 11. The method begins, in block 1202, by receiving an input signal (e.g., input signal 512, FIG. 11 or 910, FIG. 9). In block 1204, an edge adjustment process may be performed in order to adjust a transition edge of the input signal either forward or backward in time, resulting in an edge-adjusted input signal (e.g., edge-adjusted input signal 522, FIG. 11). In block 1205, a multiple-stage, edge alignment process may then be performed to produce a delayed signal (i.e., a delayed version of input signal 1122, such as signal 930, FIG. 9), which has a first type of transition (e.g., rising edges 931, FIG. 9) that is substantially aligned with an opposite type of transition (e.g., falling edges 912, FIG. 9) of the input signal.

In block 1206, the alignment is determined between "other" transitions of the delayed signal (e.g., falling edges 932, FIG. 9) and corresponding other transitions of the input signal (e.g., rising edges 911, FIG. 9). This determination may be made by comparing the input signal (e.g., signal 910) with the delayed signal (e.g., signal 930) or by comparing a processed version of the input signal (e.g., inverted input signal 940) with the delayed signal (e.g., signal 930).

In block 1208, a determination may be made whether these "other" transitions are aligned. If so, then the duty cycle correction circuit refrains from adjusting the duty cycle correction that is currently being performed (e.g., by duty cycle correction module 1110, FIG. 11), in block 1210, and the method ends. When the other transitions are not sufficiently aligned, then a determination may be made whether the duty cycle is greater than 50 percent, in block 1212 (or less than 50 percent, in another embodiment). When the duty cycle is greater than 50 percent, then in block 1214, the duty cycle correction is controlled to adjust the current duty cycle correction being performed, if any, in a manner that results in shortening the duty cycle. Conversely, when the duty cycle is less than 50 percent, then in block 1216, the duty cycle correction is controlled to adjust the current duty cycle correction being performed, if any, in a manner that results in lengthening the duty cycle. The method then continues to iterate as shown in FIG. 12.

Referring again to FIG. 11, and as mentioned previously, a post-fabrication calibration procedure may be performed in order to calibrate duty cycle correction calibration module 1100. More specifically, a post-fabrication calibration procedure may be performed in order to determine the calibrated edge adjustment time for edge adjustment circuit 1120 and the calibrated delay for multiple-stage edge alignment circuit 1130. According to various embodiments, a post-fabrication calibration procedure may be performed in the factory on a single duty cycle correction apparatus or simultaneously on a plurality of apparatus (e.g., a plurality of duty cycle correction apparatus on a same wafer). According to other embodiments, post-fabrication calibration procedures may be performed periodically or occasionally during normal operation of a device within which the duty cycle correction apparatus is incorporated.

Figure 13:
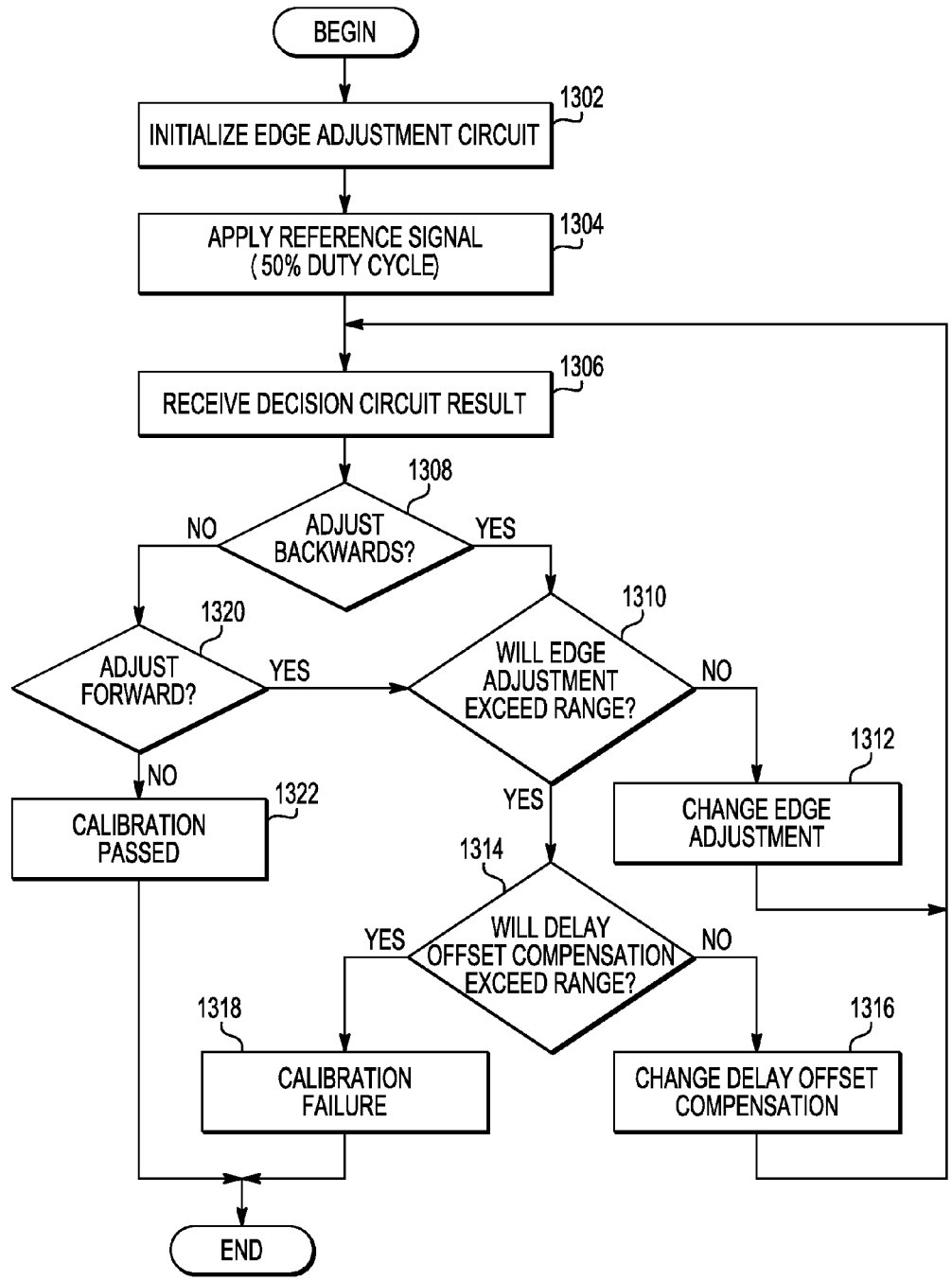
FIG. 13 is a flowchart of a method for performing a post-fabrication duty cycle calibration procedure of the memory controller of the memory system of FIG. 1 in accordance with at least one embodiment of the present disclosure.

FIG. 13 is a flowchart of a method for performing a post-fabrication calibration procedure, in accordance with an example embodiment. Referring also to FIG. 11, calibration of a duty cycle correction apparatus (e.g., duty cycle correction calibration module 1100, FIG. 11) is performed using a reference signal generator 1150 and a calibration controller 1160. The reference signal generator 1150 and/or the calibration controller 1160 may be integrally included on an integrated circuit that also includes other portions of the duty cycle correction calibration module 1100, or the reference signal generator 1150 and/or calibration controller 1160 may be external circuit components that are connectable with the duty cycle correction apparatus through ports or other connection apparatus.

The post-fabrication calibration procedure may begin by initializing the edge adjustment circuit, in block 1302. In one embodiment, this may include the calibration controller 1160 initializing a "current" calibrated edge adjustment value and a "current" calibrated delay value to zero. As discussed previously, the calibrated edge adjustment and the calibrated delay are applied in order to compensate for inherent duty cycle and delay errors imposed by the duty cycle evaluation circuit. More specifically, the current calibrated edge adjustment value represents the time increment that the edge adjustment circuit (e.g., edge adjustment circuit 1120, FIG. 11) will adjust a transition edge of an input signal (e.g., reference signal 1152) either forward or backward in order to adjust the duty cycle of the input signal. The current delay value represents an amount of delay to be applied by the edge alignment circuit (e.g., edge alignment circuit 1130, FIG. 11) to the edge-adjusted input signal (e.g., signal 1122, FIG. 11).

In block 1304, the calibration controller 1160 may produce a control signal 1162 that causes the reference signal generator 1150 to generate a reference signal 1152, which is provided to the edge adjustment circuit 1120. The reference signal 1152 is generated precisely to have a fifty percent duty cycle. The reference signal 1152 is represented as a dashed line to indicate that it is provided in conjunction with the calibration procedure, rather than during normal operations. The edge adjustment circuit 1120 adjusts a transition edge of the reference signal 1152 by the current edge adjustment value (initially zero), and the edge alignment circuit 1130 applies the current calibrated delay (initially zero) to the resulting edge-adjusted input signal 1122. Finally, the decision circuit 1140 evaluates the resulting output signal 1132 in light of the reference signal 1152, and determines whether the duty cycle of the reference signal 1152 appears to be fifty percent. Decision circuit 1140 produces a calibration decision result signal 1144. Similar to decision result signal 1142, the calibration decision result signal 1144 indicates that either the duty cycle of reference signal 1152 appears to be precisely fifty percent, or that the duty cycle appears to be low or higher than fifty percent. The calibration decision result signal 1144 is represented as a dashed line to indicate that it is provided in conjunction with the calibration procedure, rather than during normal operations.

The calibration decision result signal 1144 is received by the calibration controller 1160. Based on the calibration decision result signal 1144, the calibration controller 1160 makes a determination, in block 1308, of whether the transition edge that is to be adjusted by the edge adjustment circuit 1120 should be adjusted backwards. This determination may be made, for example, when the calibration decision result signal 1144 indicates that the duty cycle of the reference signal 1152 appears to be greater than fifty percent.

When the calibration controller 1160 determines that the transition edge should be adjusted backwards, then a decision may be made, in block 1310, of whether a change to the current calibrated edge adjustment value will cause the calibrated edge adjustment value to exceed a range of acceptable edge adjustment values. For example, the range of acceptable adjustment values may be between 0 and about 25 percent of the period of the reference signal 1152. The range may be different, in other embodiments. When a change to the current calibrated edge adjustment value will not exceed the range, then in block 1312, the current edge adjustment value is changed (e.g., by an incremental amount) to cause a larger backward adjustment, and the method iterates as shown.

Referring again to block 1310, when a determination is made that a change to the current calibrated edge adjustment value will cause the calibrated edge adjustment value to exceed the range of acceptable edge adjustment values, then no further changes may be made to the calibrated edge adjustment value. In such a case, a further determination may be made of whether a change to the current calibrated delay value will cause the calibrated delay value to exceed a range of acceptable calibrated delay values, in block 1314. For example, the range of acceptable calibrated delay values may be from zero to about 25 percent of the period of the reference signal 1152. The range may be different, in other embodiments. When a change to the current calibration delay value will not cause the calibrated delay value to exceed the range, then in block 1316, the current calibrated delay value is changed (e.g., by an incremental value) to cause a larger delay, and the method iterates as shown. When a determination is made, in block 1314, that a change to the current calibrated delay value will cause the calibrated delay value to exceed the range of acceptable calibrated delay values, then no further changes may be made to the calibrated delay value. In such a case, the calibration process has failed, and an indication to that effect may be generated, in block 1318. The calibration method may then end.

Referring again to block 1308, when a determination is made that the transition edge that is to be adjusted by the edge adjustment circuit 1120 should not be adjusted backwards, then a further determination is made, in block 1320, of whether the transition edge should be adjusted forward. This determination may be made, for example, when the calibration decision result signal 1144 indicates that the duty cycle of the reference signal 1152 appears to be less than fifty percent. When a determination is made that the transition edge should be adjusted forward, then the process may proceed to block 1310, in which a determination may be made as to whether a change to the current calibrated edge adjustment value will cause the calibrated edge adjustment value to exceed the range of acceptable values, as discussed previously. When it is determined, in block 1320, that the transition edge should not be adjusted forward, then the current calibrated edge adjustment value and the current calibrated delay value are considered to have converged to accurate calibrated values. In that case, the calibration procedure has passed, and an indication to that effect may be generated, in block 1322. The method may then end.

It is to be understood that certain ones of the process blocks depicted in FIGS. 10, 12, and 13 may be performed in parallel with each other or with performing other processes. In addition, it is to be understood that the particular ordering of the process blocks depicted in FIGS. 10, 12, and 13 may be modified, while achieving substantially the same result. Accordingly, such modifications are intended to be included within the scope of the inventive subject matter.

In accordance with one aspect of the present disclosure, a method is provided for a memory controller coupled to a memory. The method includes calibrating an output impedance of a driver of an input/output (I/O) cell of the memory controller that is associated with a signal conducted between the memory controller and the memory. The method further includes calibrating an offset bias applied to at least one transistor of an input stage of a receiver of the I/O cell subsequent to calibrating the output impedance of the driver of the I/O cell. Subsequent to calibrating the offset bias, the method includes calibrating a termination resistance of the I/O cell and calibrating a duty cycle correction applied in a path of the memory controller that is associated with the I/O cell. The method also may include recalibrating the output impedance of the driver subsequent to calibrating the offset bias. In one aspect, the output impedance is recalibrated prior to calibrating the termination resistance and the termination resistance is calibrated prior to calibrating the duty cycle correction. In another aspect, the duty cycle correction is calibrated prior to calibrating the termination resistance. Alternately, the duty cycle correction is calibrated subsequent to calibrating the termination resistance.

In one embodiment, the path comprises a transmit path of the memory controller, and the method further includes calibrating a duty cycle correction applied in a receive path of the memory controller that is associated with the I/O cell subsequent to calibrating the duty cycle correction applied in the transmit path.

In one embodiment, calibrating the offset bias includes setting an input of the driver to a reference voltage and providing a resulting output of the driver to a first input of the receiver, providing the reference voltage to a second input of the receiver, and adjusting the offset bias applied to at least one transistor of the input stage of the receiver until a transition in an output level of the receiver is detected.

In one embodiment, the termination resistance comprises a pull-up resistance and a pull-down resistance, and calibrating the termination resistance of the I/O cell includes setting an input of the driver to a reference voltage and providing a resulting output of the driver to a first input of the receiver, providing the reference voltage to a second input of the receiver, and adjusting at least one of the pull-up resistance and the pull-down resistance until a transition in an output level of the receiver is detected.

In accordance with another aspect of the present disclosure, a memory controller comprises an input/output (I/O) cell to conduct a signal between the memory controller and a memory, the I/O cell comprising a driver, a receiver, and a termination circuit. The memory further includes a duty cycle correction controller to correct a duty cycle of the signal for a path of the memory that is associated with the I/O cell. The memory also includes a calibration controller to calibrate an output impedance of the driver, and calibrate an offset bias applied to at least one transistor of an input stage of the receiver subsequent to calibrating the output impedance of the driver. Subsequent to calibrating the offset bias, the calibration controller is to calibrate a termination resistance provided by the termination circuit and calibrate a duty cycle correction applied in the path to the signal by the duty cycle correction controller. The calibration controller further can recalibrate the output impedance of the driver subsequent to calibrating the offset bias. The memory controller can include a dual data rate (DDR)-based memory controller.

In one embodiment, the calibration controller recalibrates the output impedance prior to calibrating the termination resistance and the calibration controller calibrates the termination resistance prior to calibrating the duty cycle correction. In another embodiment, the calibration controller calibrates the duty cycle correction prior to calibrating the termination resistance. Alternately, the calibration controller calibrates the duty cycle correction subsequent to calibrating the termination resistance.

In one embodiment, the path comprises a transmit path of the memory controller, the memory controller further comprises a receive path associated with the I/O cell, and the calibration controller is to calibrate a duty cycle correction applied in the receive path subsequent to calibrating the duty cycle correction applied in the transmit path.

In one embodiment, the calibration controller is to calibrate the offset bias applied to at least one transistor of the input stage of the receiver by setting an input of the driver to a reference voltage and providing a resulting output of the driver to a first input of the receiver, providing the reference voltage to a second input of the receiver, and adjusting the offset bias applied to at least one transistor of the input stage of the receiver until a transition in an output level of the receiver is detected.

In one embodiment, the termination circuit comprises a plurality of pull-up transistors coupled in parallel and a plurality of pull-down transistors coupled in parallel. The calibration controller is to calibrate the termination resistance of the termination circuit by setting an input of the driver to a reference voltage and providing a resulting output of the driver to a first input of the receiver, providing the reference voltage to a second input of the receiver, and adjusting a number of transistors of the plurality of pull-up transistors that are enabled and adjusting a number of transistors of the plurality of pull-down transistors that are enabled until a transition in an output level of the receiver is detected.

The terms "including", "having", or any variation thereof, as used herein, are defined as comprising. Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. In a memory controller operably coupled to a memory, a method comprising:
   calibrating an offset bias applied to at least one transistor of an input stage of a receiver of an input/output (I/O) cell that is associated with a signal conducted between the memory controller and the memory; and
   subsequent to calibrating the offset bias:
      calibrating a termination resistance of the I/O cell; and
      calibrating a duty cycle correction applied in a path of the memory controller that is associated with the I/O cell.

2. The method of claim 1, further comprising:
calibrating an output impedance of a driver of the I/O cell prior to calibrating the offset bias.

3. The method of claim 2, further comprising:
recalibrating the output impedance of the driver subsequent to calibrating the offset bias.

4. The method of claim 3, wherein:
the output impedance is recalibrated prior to calibrating the termination resistance; and
the termination resistance is calibrated prior to calibrating the duty cycle correction.

5. The method of claim 1, wherein:
the duty cycle correction is calibrated prior to calibrating the termination resistance.

6. The method of claim 1, wherein:
the duty cycle correction is calibrated subsequent to calibrating the termination resistance.

7. The method of claim 1, wherein the path comprises a transmit path of the memory controller, and the method further comprises:
calibrating a duty cycle correction applied in a receive path of the memory controller that is associated with the I/O cell subsequent to calibrating the duty cycle correction applied in the transmit path.

8. The method of claim 1, wherein calibrating the offset bias comprises:
setting an input of the driver to a reference voltage and providing a resulting output of the driver to a first input of the receiver;
providing the reference voltage to a second input of the receiver; and
adjusting the offset bias applied to at least one transistor of the input stage of the receiver until a transition in an output level of the receiver is detected.

9. The method of claim 1, wherein the termination resistance comprises a pull-up resistance and a pull-down resistance, and calibrating the termination resistance of the I/O cell comprises:
setting an input of the driver to a reference voltage and providing a resulting output of the driver to a first input of the receiver;
providing the reference voltage to a second input of the receiver; and
adjusting at least one of the pull-up resistance and the pull-down resistance until a transition in an output level of the receiver is detected.

10. The method of claim 1, wherein the memory comprises a dual data rate (DDR)-based memory.

11. A memory controller comprising:
an input/output (I/O) cell to conduct a signal between the memory controller and a memory, the I/O cell comprising a driver, a receiver, and a termination circuit;
a duty cycle correction module to correct a duty cycle of the signal for a path of the memory that is associated with the I/O cell; and
a calibration controller to:
   calibrate an offset bias applied to at least one transistor of an input stage of the receiver; and
   subsequent to calibrating the offset bias:
      calibrate a termination resistance provided by the termination circuit; and
      calibrate a duty cycle correction applied in the path to the signal by the duty cycle correction controller.

12. The memory controller of claim 11, wherein the calibration controller further is to calibrate an output impedance of the driver prior to calibrating the offset bias.

13. The memory controller of claim 12, wherein the calibration controller further is to:
recalibrate the output impedance of the driver subsequent to calibrating the offset bias.

14. The memory controller of claim 12, wherein:
the calibration controller recalibrates the output impedance prior to calibrating the termination resistance; and
the calibration controller calibrates the termination resistance prior to calibrating the duty cycle correction.

15. The memory controller of claim 11, wherein:
the calibration controller calibrates the duty cycle correction prior to calibrating the termination resistance.

16. The memory controller of claim 11, wherein:
the calibration controller calibrates the duty cycle correction subsequent to calibrating the termination resistance.

17. The memory controller of claim 11, wherein:
the path comprises a transmit path of the memory controller;
the memory controller further comprises a receive path associated with the I/O cell; and the calibration controller is to calibrate a duty cycle correction applied in the receive path subsequent to calibrating the duty cycle correction applied in the transmit path.

18. The memory controller of claim 11, wherein the calibration controller is to calibrate the offset bias applied to at least one transistor of the input stage of the receiver by:

setting an input of the driver to a reference voltage and providing a resulting output of the driver to a first input of the receiver;

providing the reference voltage to a second input of the receiver; and adjusting the offset bias applied to at least one transistor of the input stage of the receiver until a transition in an output level of the receiver is detected.

19. The memory controller of claim 11, wherein:

the termination circuit comprises a plurality of pull-up transistors coupled in parallel and a plurality of pull-down transistors coupled in parallel; and the calibration controller is to calibrate the termination resistance of the termination circuit by:

setting an input of the driver to a reference voltage and providing a resulting output of the driver to a first input of the receiver;

providing the reference voltage to a second input of the receiver; and adjusting a number of transistors of the plurality of pull-up transistors that are enabled and adjusting a number of transistors of the plurality of pull-down transistors that are enabled until a transition in an output level of the receiver is detected.

20. The memory controller of claim 11, wherein the memory controller comprises a dual data rate (DDR)-based memory controller.

* * * * *